United States Patent
Sakaguchi et al.

(10) Patent No.: US 8,917,557 B2
(45) Date of Patent: Dec. 23, 2014

(54) NONVOLATILE SEMICONDUCTOR MEMORY DEVICE

(71) Applicants: Natsuki Sakaguchi, Tokyo (JP); Hiroshi Maejima, Tokyo (JP)

(72) Inventors: Natsuki Sakaguchi, Tokyo (JP); Hiroshi Maejima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 184 days.

(21) Appl. No.: 13/715,317

(22) Filed: Dec. 14, 2012

(65) Prior Publication Data
US 2013/0155778 A1   Jun. 20, 2013

(30) Foreign Application Priority Data

Dec. 15, 2011 (JP) ................................. 2011-274117
Aug. 29, 2012 (JP) ................................. 2012-188500

(51) Int. Cl.
| | | |
|---|---|---|
| G11C 11/34 | (2006.01) | |
| G11C 16/10 | (2006.01) | |
| G11C 16/04 | (2006.01) | |
| G11C 16/24 | (2006.01) | |
| G11C 16/26 | (2006.01) | |
| G11C 7/06 | (2006.01) | |

(52) U.S. Cl.
CPC ............ *G11C 16/10* (2013.01); *G11C 16/0483* (2013.01); *G11C 16/24* (2013.01); *G11C 16/26* (2013.01); *G11C 7/067* (2013.01)
USPC ............ 365/185.25; 365/189.07; 365/185.02; 365/185.03; 365/185.17; 365/203

(58) Field of Classification Search
CPC ...... G11C 16/0483; G11C 16/26; G11C 7/12; G11C 11/5642; G11C 11/4091
USPC ............ 365/185.25, 185.02, 185.03, 185.17, 365/203
See application file for complete search history.

(56) References Cited

U.S. PATENT DOCUMENTS

| | | |
|---|---|---|
| 7,660,157 B2 | 2/2010 | Maejima et al. |
| 7,663,932 B2 | 2/2010 | Hamada et al. |
| 7,782,673 B2 | 8/2010 | Maejima et al. |
| 7,916,541 B2 | 3/2011 | Maejima et al. |

(Continued)

FOREIGN PATENT DOCUMENTS

| | | |
|---|---|---|
| JP | 2008-103003 | 5/2008 |
| JP | 2009-146954 | 7/2009 |

(Continued)

OTHER PUBLICATIONS

Office Action issued Aug. 5, 2014 in Japanese Patent Application No. 2011-274117 (with English translation).

*Primary Examiner* — Toan Le
*Assistant Examiner* — Ajay Ojha
(74) *Attorney, Agent, or Firm* — Oblon, Spivak, McClelland, Maier & Neustadt, L.L.P.

(57) ABSTRACT

According to one embodiment, a nonvolatile semiconductor memory device comprises a semiconductor substrate, memory strings formed above the semiconductor substrate, and a control circuit configured to control voltages applied to the memory cells. In a read operation, when the control circuit precharges a first source line electrically connected to a selected memory string to a first voltage, the control circuit precharges a second source line electrically connected to an unselected memory string to a second voltage, the second voltage being higher than the first voltage, and after the second source line is precharged, the control circuit precharges a first bit line electrically connected to the selected memory string to the second voltage.

17 Claims, 21 Drawing Sheets

(56) References Cited

U.S. PATENT DOCUMENTS

| | | |
|---|---|---|
| 7,936,004 B2 | 5/2011 | Kito et al. |
| 8,094,501 B2 | 1/2012 | Maejima et al. |
| 8,139,420 B2 | 3/2012 | Hamada et al. |
| 8,427,881 B2 * | 4/2013 | Jang et al. ............... 365/185.25 |
| 2007/0247908 A1 | 10/2007 | Aritome et al. |
| 2008/0094903 A1 | 4/2008 | Maejima et al. |
| 2009/0168533 A1 * | 7/2009 | Park et al. ............... 365/185.17 |
| 2009/0251962 A1 * | 10/2009 | Yun et al. ............... 365/185.02 |
| 2009/0268524 A1 | 10/2009 | Maejima |
| 2010/0207195 A1 | 8/2010 | Fukuzumi et al. |
| 2010/0214837 A1 * | 8/2010 | Sako et al. ............... 365/185.03 |

FOREIGN PATENT DOCUMENTS

| | | |
|---|---|---|
| JP | 2009-266281 | 11/2009 |
| JP | 2010-27141 | 2/2010 |
| JP | 2011-065723 | 3/2011 |

* cited by examiner

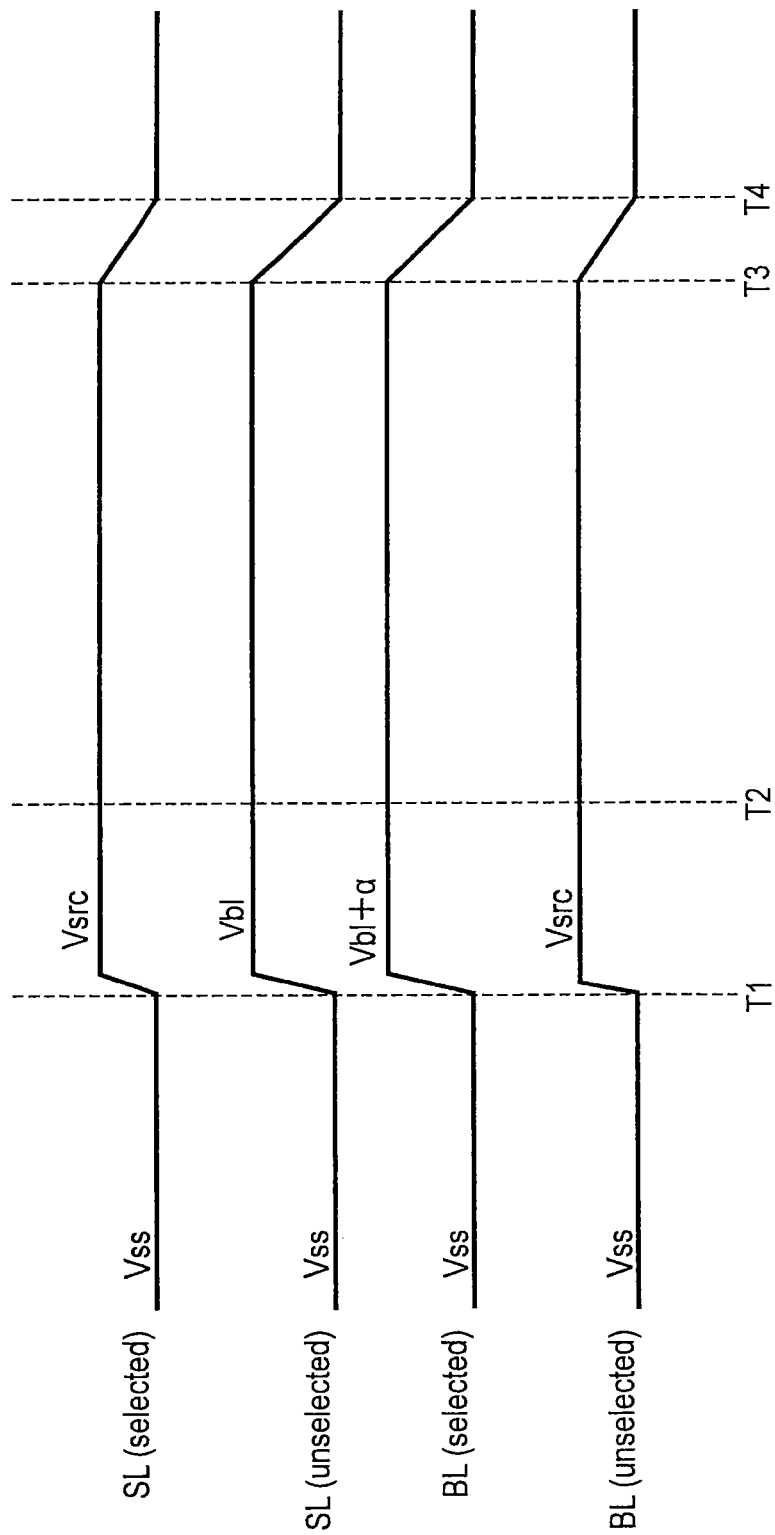
F I G. 1

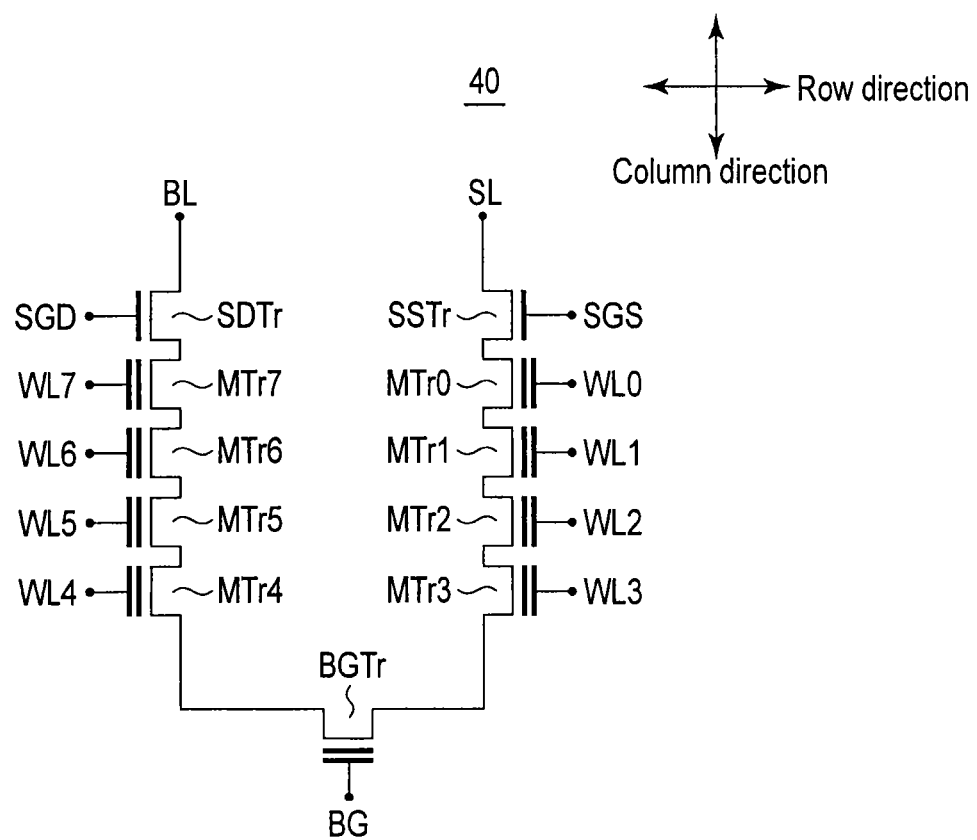
F I G. 8

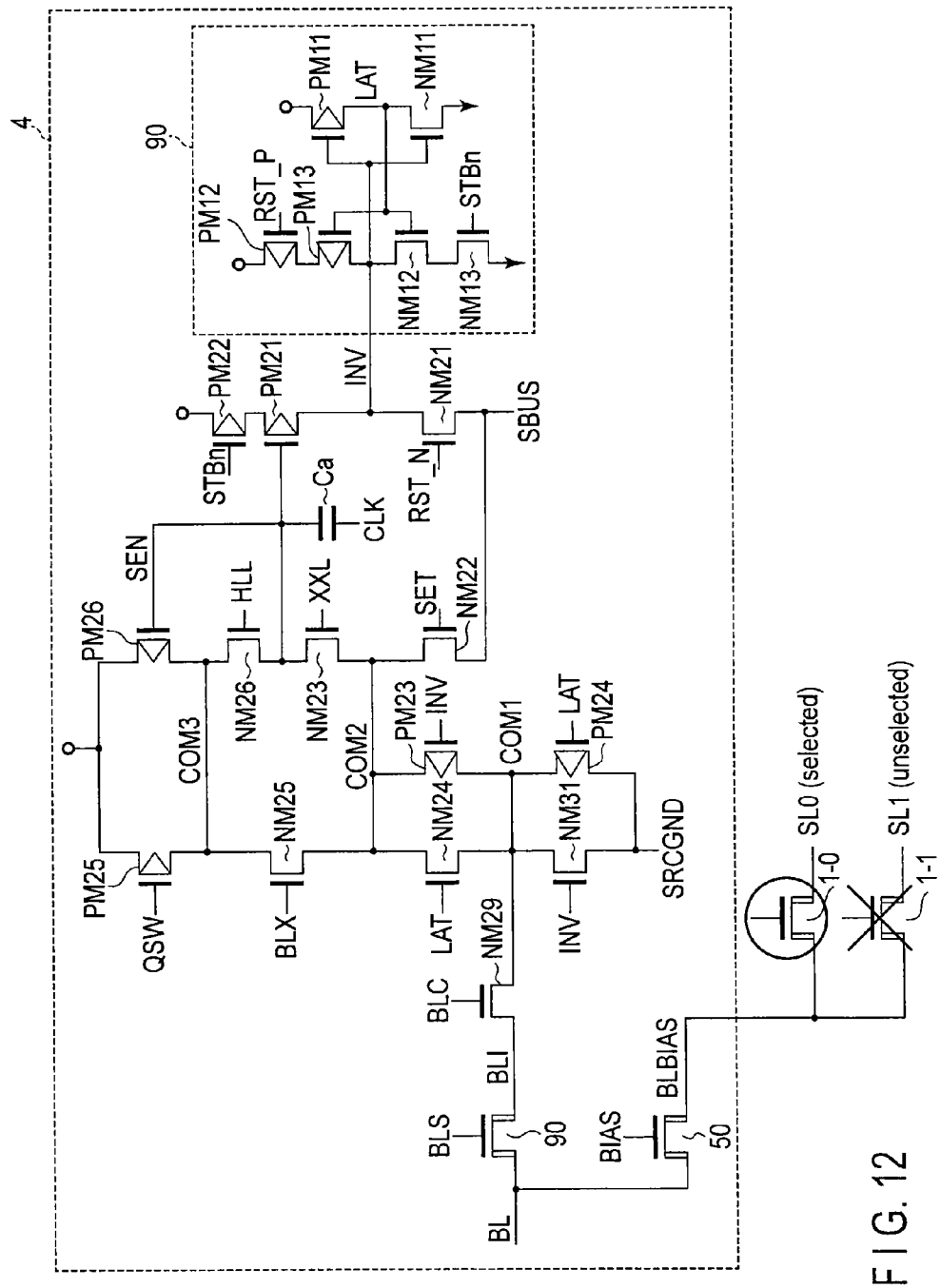
F I G. 12

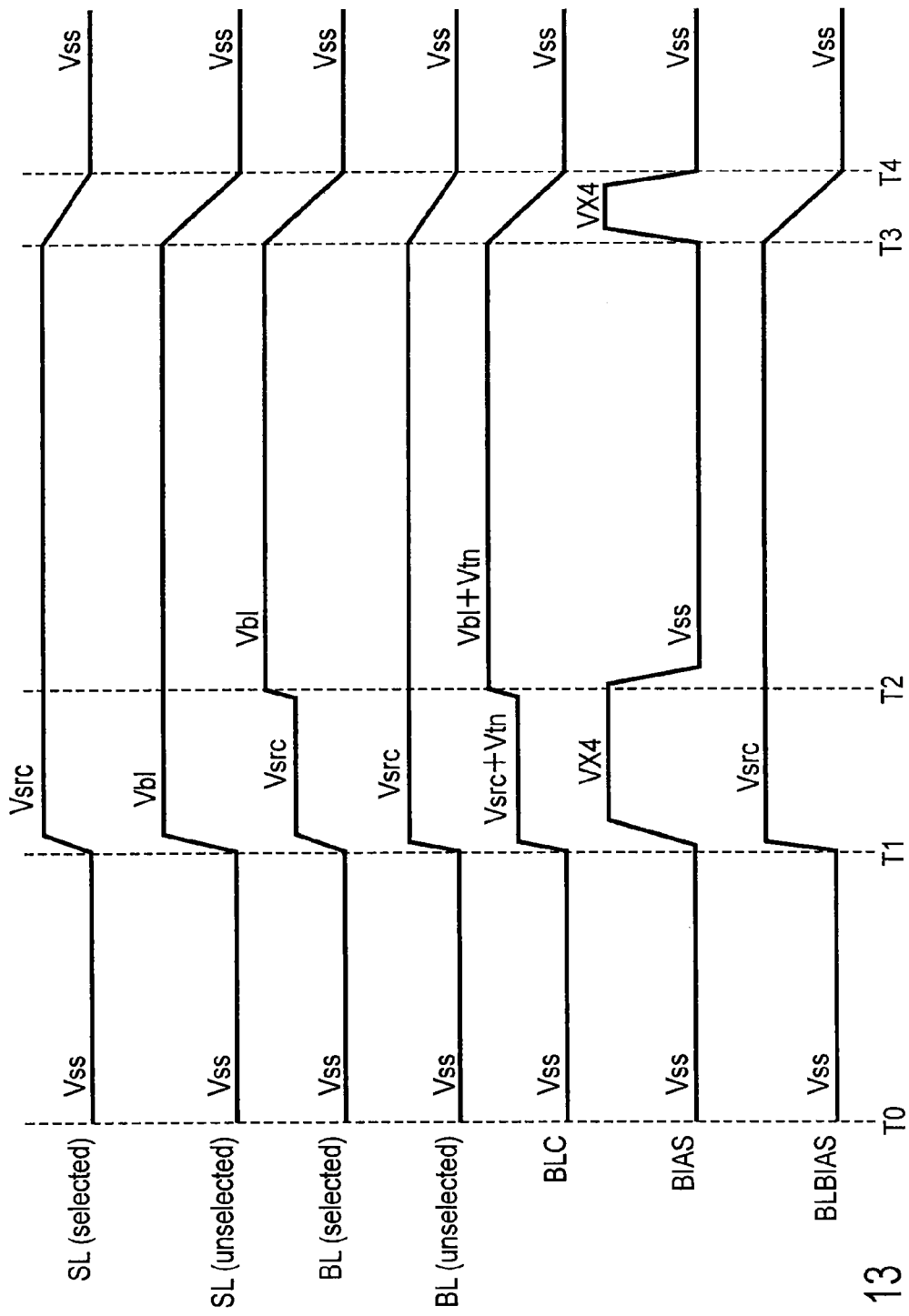
F I G. 13

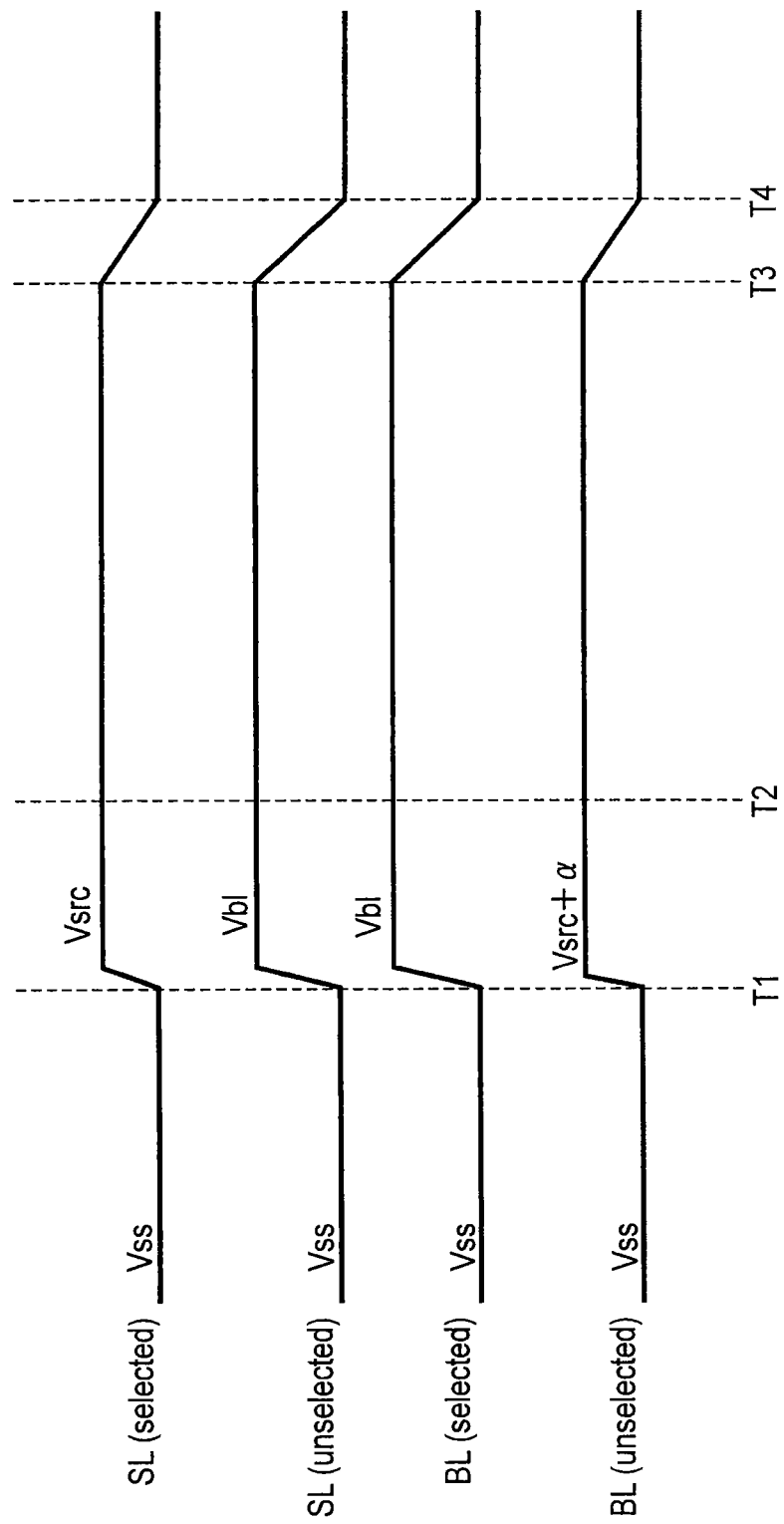
F I G. 14

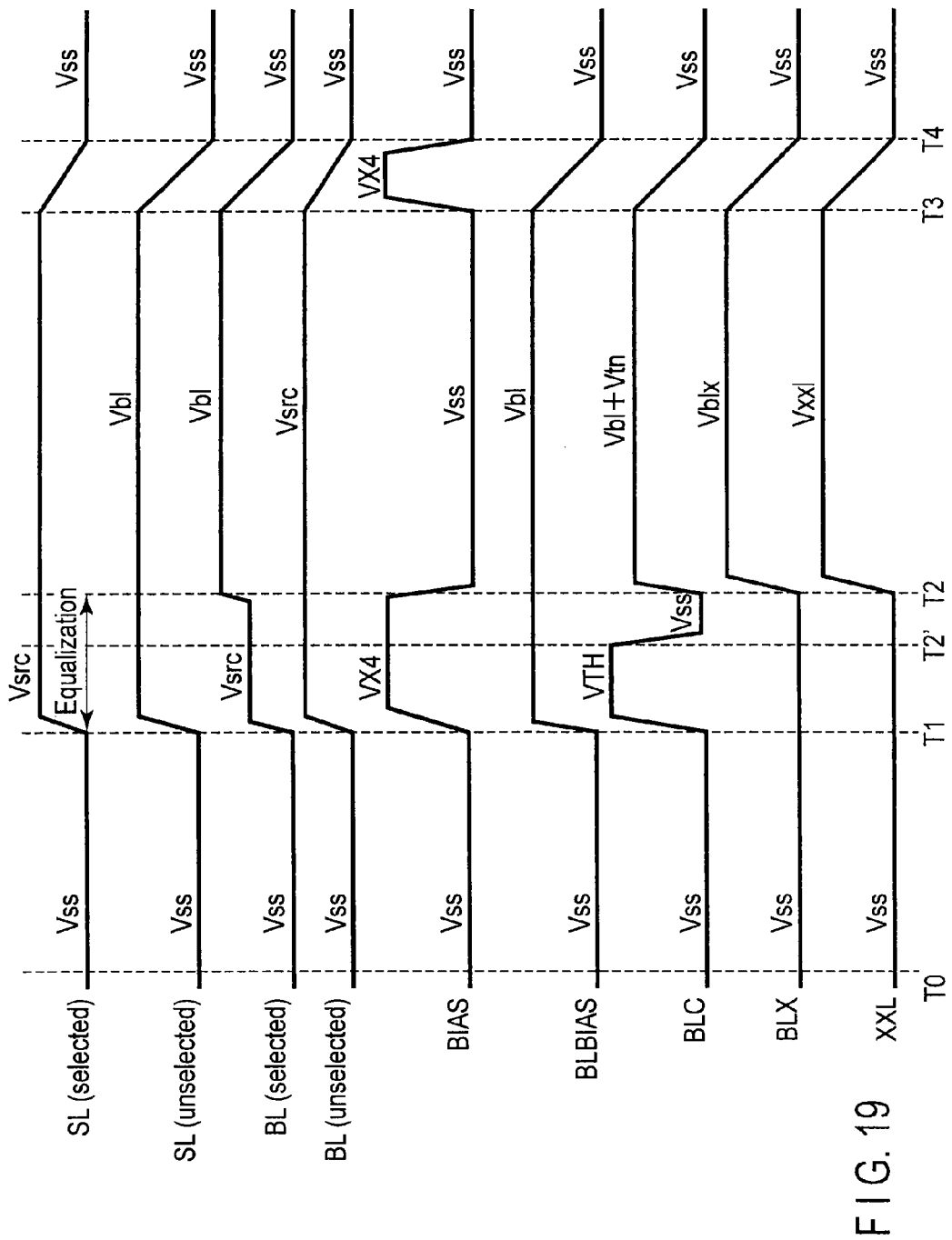
F I G. 19

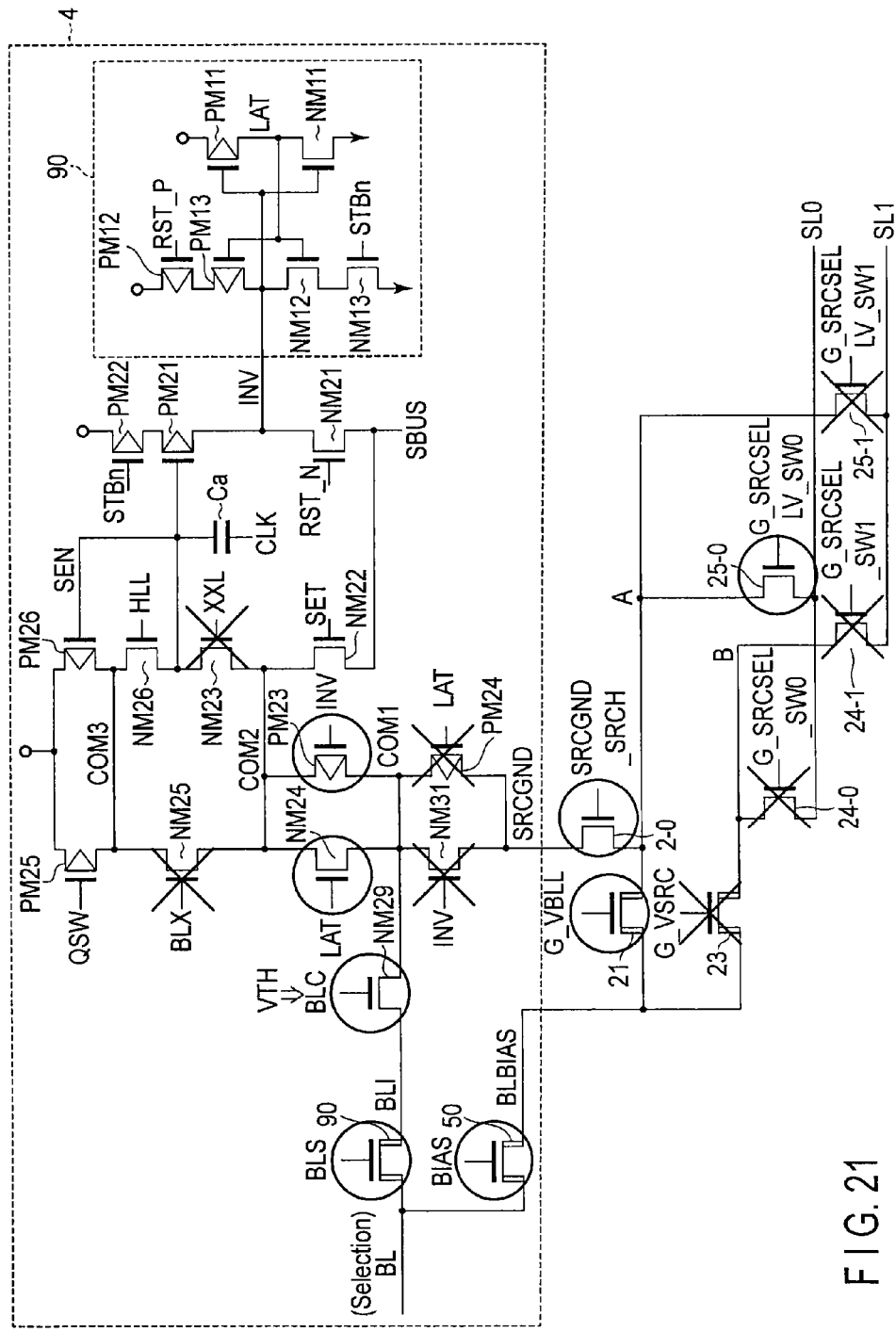
F I G. 21

NONVOLATILE SEMICONDUCTOR MEMORY DEVICE

CROSS-REFERENCE TO RELATED APPLICATIONS

This application is based upon and claims the benefit of priority from Japanese Patent Applications No. 2011-274117, filed Dec. 15, 2011; and No. 2012-188500, filed Aug. 29, 2012, the entire contents of all of which are incorporated herein by reference.

FIELD

Embodiments described herein relate generally to a nonvolatile semiconductor memory device.

BACKGROUND

A three-dimensional stacked memory stacked in a vertical direction and processed at a time has been suggested as a NAND flash memory.

In the three-dimensional stacked memory, a cylindrical hole (memory hole) is formed at a time in multiple electrodes stacked on a semiconductor substrate, and a memory film is formed on the inner wall of the hole, and thereafter polysilicon (silicon pillar) is formed in the hole. As a result, a NAND string including multiple MONOS memory cells connected in series in the stacking direction, with the silicon pillar being the channel, can be formed at a time.

In the three-dimensional stacked memory, the U-shaped silicon pillar is used as the channel of the memory string. The U-shaped silicon pillar includes a pair of pillar-shaped portions and a connection portion connecting them at the lower ends. At the upper portion, one of the pair of pillar-shaped portions is connected to a bit line, and the other of them is connected to a source line.

BRIEF DESCRIPTION OF THE DRAWINGS

FIG. 1 is a timing chart illustrating various voltages in a read operation of a nonvolatile semiconductor memory device according to a first comparative example;

FIG. 8 is a circuit diagram illustrating the NAND string of FIG. 6;

FIG. 12 is a circuit diagram illustrating a sense amplifier according to the second embodiment;

FIG. 13 is a timing chart illustrating precharge in a read operation according to the second embodiment;

FIG. 14 is a timing chart illustrating precharge in a read operation according to a second comparative example;

FIG. 19 is a timing chart illustrating precharge in a read operation according to the third embodiment;

FIG. 21 is a circuit diagram illustrating an equalization operation of a sense amplifier connected to a selected bit line according to the third embodiment.

DETAILED DESCRIPTION

Figure 2:
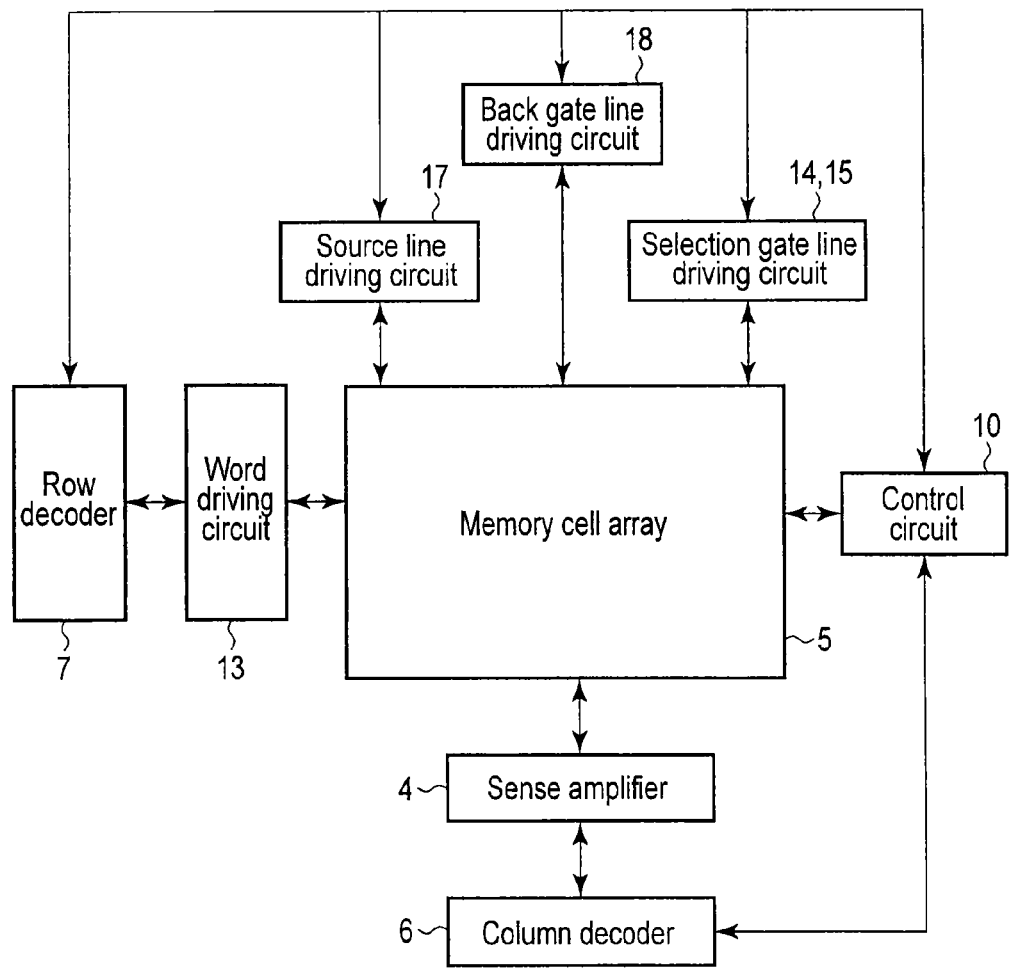
FIG. 2 is a block diagram illustrating an example of an entire configuration of a nonvolatile semiconductor memory device according to a first embodiment.

In general, according to one embodiment, nonvolatile semiconductor memory device includes: a semiconductor substrate; memory strings formed above the semiconductor substrate; and a control circuit configured to control voltages applied to the memory cells. In a read operation, when the control circuit precharges a first source line electrically connected to a selected memory string to a first voltage, the control circuit precharges a second source line electrically connected to an unselected memory string to a second voltage, the second voltage being higher than the first voltage, and after the second source line is precharged, the control circuit precharges a first bit line electrically connected to the selected memory string to the second voltage.

[Precharge in Read Operation According to First Comparative Example]

In a three-dimensional stacked memory, a NAND string is formed along a U-shaped silicon pillar. Accordingly, both of a source line SL and a bit line BL are located at an upper side. More specifically, the distance between the source line SL and the bit line BL is shorter than that of a flat-type two-dimensional NAND flash memory.

In the three-dimensional stacked memory, a threshold value of a selection gate is negative. Accordingly, in a read operation (precharge), it is necessary to perform negative sense. More specifically, by applying a positive voltage to a source line SL, the threshold value of the selection gate is made into a pseudo positive value.

At this occasion, in the flat-type two-dimensional NAND flash memory, even if a reverse bias current is generated, the reverse bias current flows to a substrate, and therefore, no leak current flows between the bit line BL and the source line SL. However, in the three-dimensional stacked memory, there is no substrate, and the reverse bias current flows between BL and SL as a leak current. In order to reduce this leak current, the source line SL (source line driving circuit) is divided into multiple lines. More specifically, a source line SL connected to a read-target memory cell is adopted as a selected source line SL, and the other line is adopted as an unselected source line SL. As shown in FIG. 1, a voltage Vsrc which is less than a voltage Vbl applied to the selected bit line BL is applied to the selected source line SL, and a voltage Vbl is applied to the unselected source line SL. As described above, when the voltage of the unselected source line SL is set at a voltage about the same as the voltage of the selected bit line BL, the leak current can be reduced to the minimum level.

However, because the distance between the source line SL and the bit line BL is short, the effect of capacitive coupling between the bit line BL and the source line SL also increases at the same time. For this reason, as shown in the first comparative example of FIG. 1, when the voltage Vbl is applied to the selected bit line BL and the unselected source line SL with the same timing, a voltage Vbl+α (α is positive) is applied to the selected bit line BL due to this capacitive coupling. Because of this kind of over precharge of the selected bit line BL, the reliability of the read operation is degraded.

In contrast, the first and second embodiments are provided to solve the above problem by adjusting the timing of the precharge of the bit line BL and the source line SL during a read operation.

The first and second embodiments will be hereinafter explained with reference to the drawings. In the drawings, the same portions are denoted with the same reference numerals. Repeated explanation will be made as necessary.

<First Embodiment>

The nonvolatile semiconductor memory device according to the first embodiment will be explained with reference to FIGS. 2 to 10. The first embodiment is an example of precharge during a read operation, wherein the unselected source line SL is precharged and thereafter the selected bit line BL is precharged. Accordingly, this can suppress over precharge of the selected bit line BL due to coupling with the unselected source line SL. Hereinafter, the nonvolatile semiconductor memory device according to the first embodiment will be explained in detail.

[Example of Overall Configuration of First Embodiment]

Hereinafter, an example of an overall configuration of the nonvolatile semiconductor memory device according to the first embodiment will be explained with reference to FIGS. 2 and 3.

FIG. 2 is a block diagram illustrating an example of an entire configuration of the nonvolatile semiconductor memory device according to the first embodiment.

As shown in FIG. 2, the nonvolatile semiconductor memory device includes a control circuit 10, a sense amplifier 4, a memory cell array 5, a column decoder 6, a row decoder 7, a word line driving circuit 13, a selection gate line driving circuit (source side selection gate line driving circuit 14 and a drain side selection gate line driving circuit 15), a source line driving circuit 17, and a back gate line driving circuit 18.

The memory cell array 5 includes multiple blocks BLK. Each multiple block BLK includes multiple word lines WL and bit lines BL and multiple NAND strings (memory string) 40 arranged in a matrix form.

During a write operation, read operation, and erase operation, the control circuit 10 generates and controls voltages provided to memory cells in the memory cell array 5, and in accordance with a command given from the outside, controls the column decoder 6, the row decoder 7, the selection gate line driving circuit, the source line driving circuit 17, and the back gate line driving circuit 18.

In accordance with the control of the control circuit 10, the column decoder 6 selects a bit line BL during a write operation, read operation, and erase operation.

The sense amplifier 4 is connected to the column decoder 6, and during a write operation, read operation, and erase operation, provides a voltage to a bit line BL selected and unselected by the column decoder 6. The sense amplifier 4 may be integrally formed with the column decoder 6.

In accordance with the control of the control circuit 10, the row decoder 7 selects a word line WL during a write operation, read operation, and erase operation.

The word line driving circuit 13 is connected to the row decoder 7, and during a write operation, read operation, and erase operation, provides a voltage to a word line WL selected and unselected by the row decoder 7. The word line driving circuit 13 may be integrally formed with the row decoder 7.

In accordance with the control of the control circuit 10, the selection gate line driving circuit provides a voltage to a selection gate SG during a write operation, read operation, and erase operation.

In accordance with the control of the control circuit 10, the source line driving circuit 17 provides a voltage to a source line SL during a write operation, read operation, and erase operation.

In accordance with the control of the control circuit 10, the back gate line driving circuit 18 provides a voltage to the back gate BG during a write operation, read operation, and erase operation.

Figure 3:
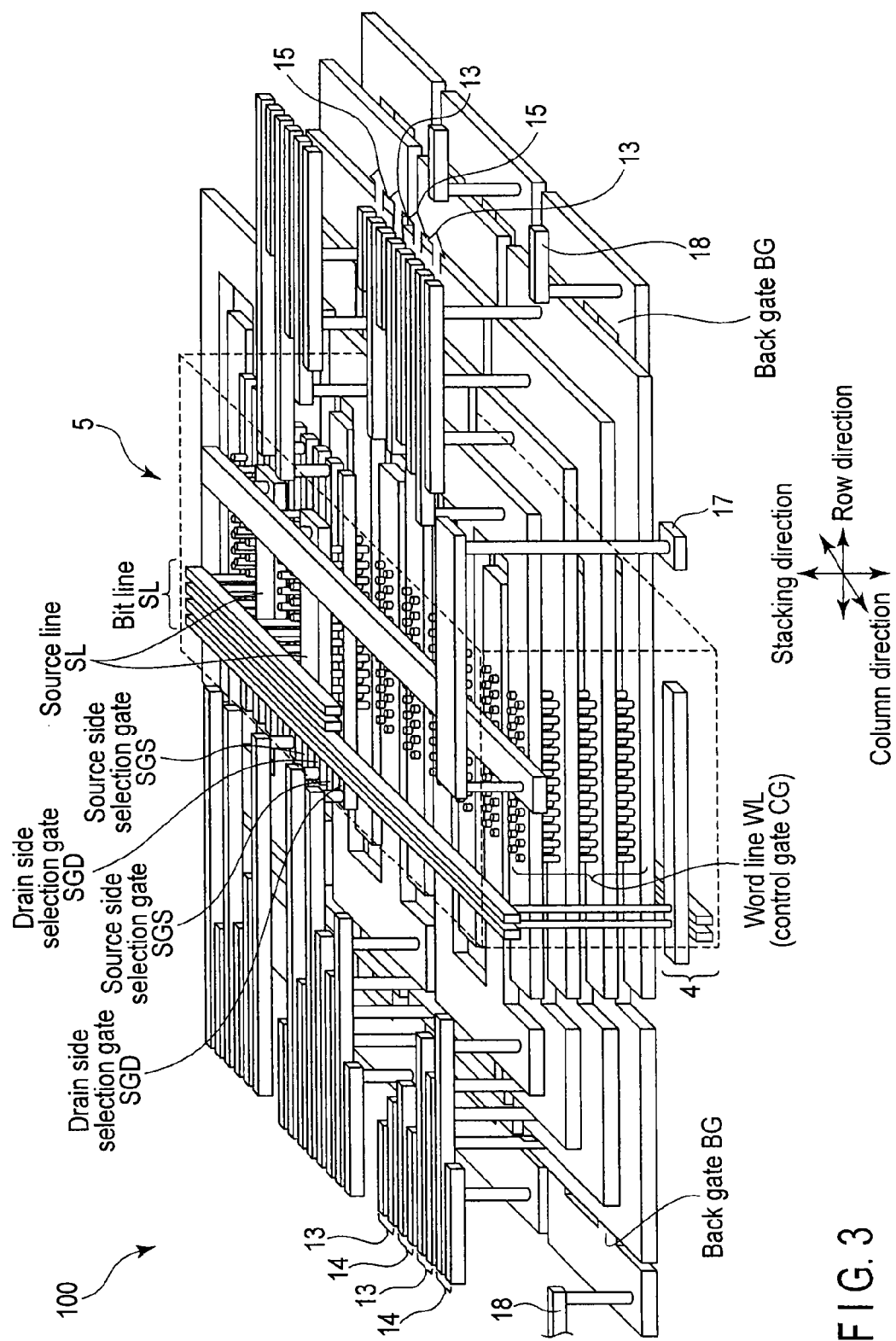
FIG. 3 is a perspective view illustrating an example of an entire configuration of the nonvolatile semiconductor memory device according to the first embodiment.

FIG. 3 is a perspective view illustrating an example of an entire configuration of the nonvolatile semiconductor memory device according to the first embodiment.

As shown in FIG. 3, the memory cell array 5 includes multiple word lines WL (control gates CG), multiple bit lines BL, multiple source lines SL, multiple back gates BG, multiple source side selection gates SGS, and multiple drain side selection gates SGD.

In this memory cell array 5, a memory cell transistor MTr storing data is arranged at each crossing portion between a U-shaped silicon pillar SP explained later and the multiple stacked word lines WL.

End portions of the multiple stacked word lines WL in a row direction are made in a staircase manner, and a contact is connected to the upper surface of each step. At the upper portions, these contacts are respectively connected to wires. In the column direction, even-numbered control gates CG are connected to each other at an end in the row direction, and odd-numbered control gates CG are connected to each other at the other end in the row direction. FIG. 1 shows an example where four layers of word lines WL are stacked, but the embodiment is not limited thereto.

Contacts are connected to the upper surfaces of the end portions, in the row direction, of the source lines SL, the back gates BG, the source side selection gates SGS, and the drain side selection gates SGD, and wires are connected thereto at the upper portions.

The word line driving circuit 13 is connected to the word lines WL via the wires and the contacts formed at the upper portion.

The source side selection gate line driving circuit 14 is connected to the source side selection gates SGS via the wires and the contacts formed at the upper portion.

The drain side selection gate line driving circuit 15 is connected to the drain side selection gates SGD via the wires and the contacts formed at the upper portion.

The back gate driving circuit 18 is connected to the back gates BG via the wires and the contacts formed at the upper portion.

The source line driving circuit 17 is connected to the source lines SL via the wires and the contacts formed at the upper portion. Multiple source line driving circuits 17 are provided. Each of the source line driving circuits 17 is commonly connected to a predetermined number of source lines SL, and is controlled independently by the control circuit 10.

The sense amplifier 4 is connected via the contacts connected to the lower surfaces of the end portions in the column direction of the bit lines BL. The details of the sense amplifier 4 according to the present embodiment will be explained later.

In FIG. 3, all the wires connected to various driving circuits are formed in the wire layer of the same level, but the embodiment is not limited thereto. They may be formed in wire layers of different levels. The number of various driving circuits is determined in accordance with the number of gates, but one driving circuit may be connected to one gate, or one driving circuit may be connected to a predetermined number of gates.

[Example of Configuration of Memory Cell Array According to First Embodiment]

Hereinafter, an example of a configuration of the memory cell array 5 according to the first embodiment will be explained with reference to FIGS. 4 and 5.

Figure 4:
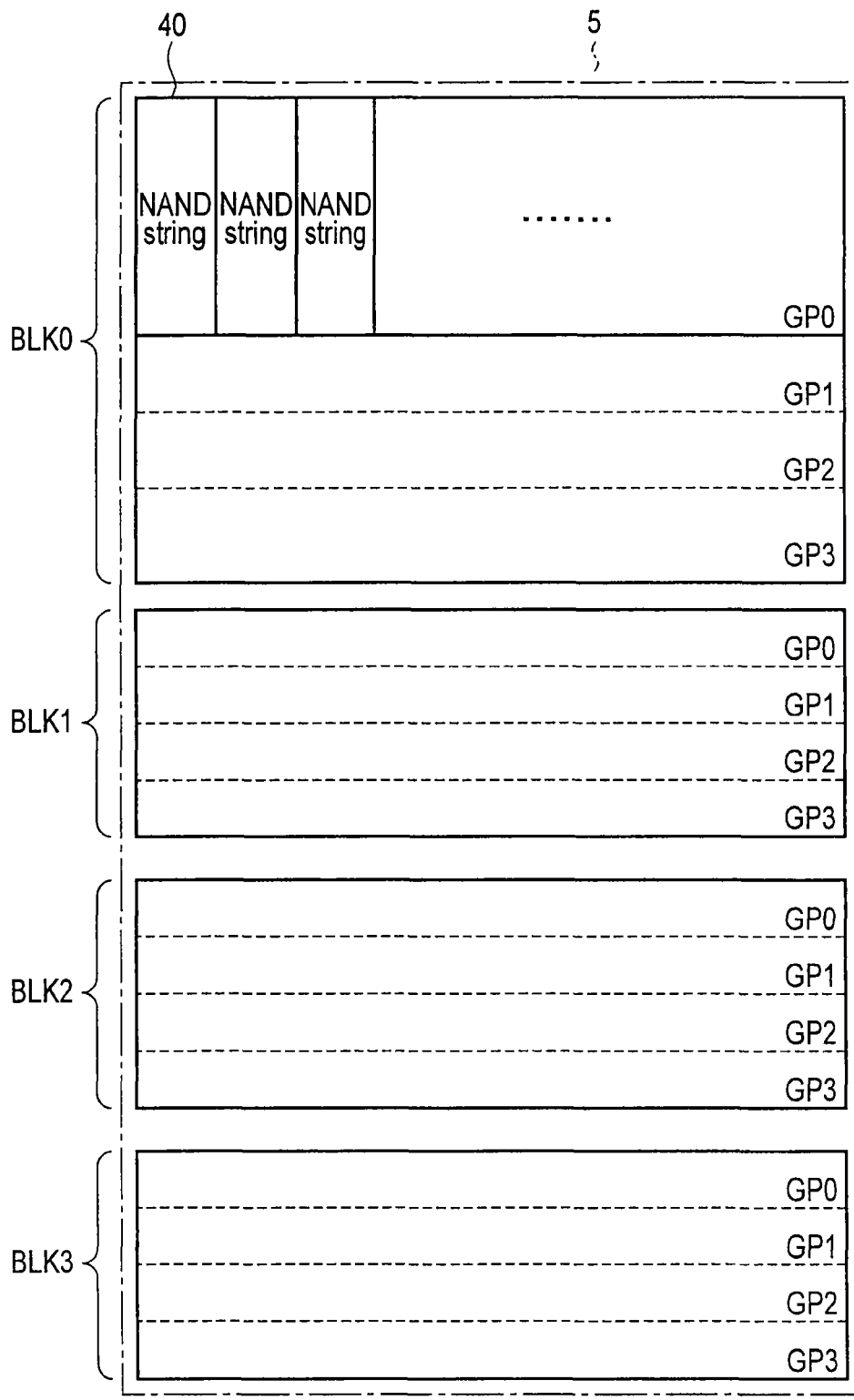
FIG. 4 is a block diagram illustrating a memory cell array according to the first embodiment.

FIG. 4 is a block diagram illustrating the memory cell array 5 according to the first embodiment.

As shown in FIG. 4, the memory cell array 5 includes multiple blocks (in this case, blocks BLK0 to 3). Each block BLK includes multiple memory groups (in this case, memory groups GP0 to 3). Each memory group GP includes multiple NAND strings 40. The erase operation is performed for each block BLK in the memory cell 5. In the explanation below, when not distinguished from each other, the blocks BLK0 to 3 may be simply referred to as blocks BLK, and the memory groups GP0 to 3 may be simply referred to as memory groups GP.

Figure 5:
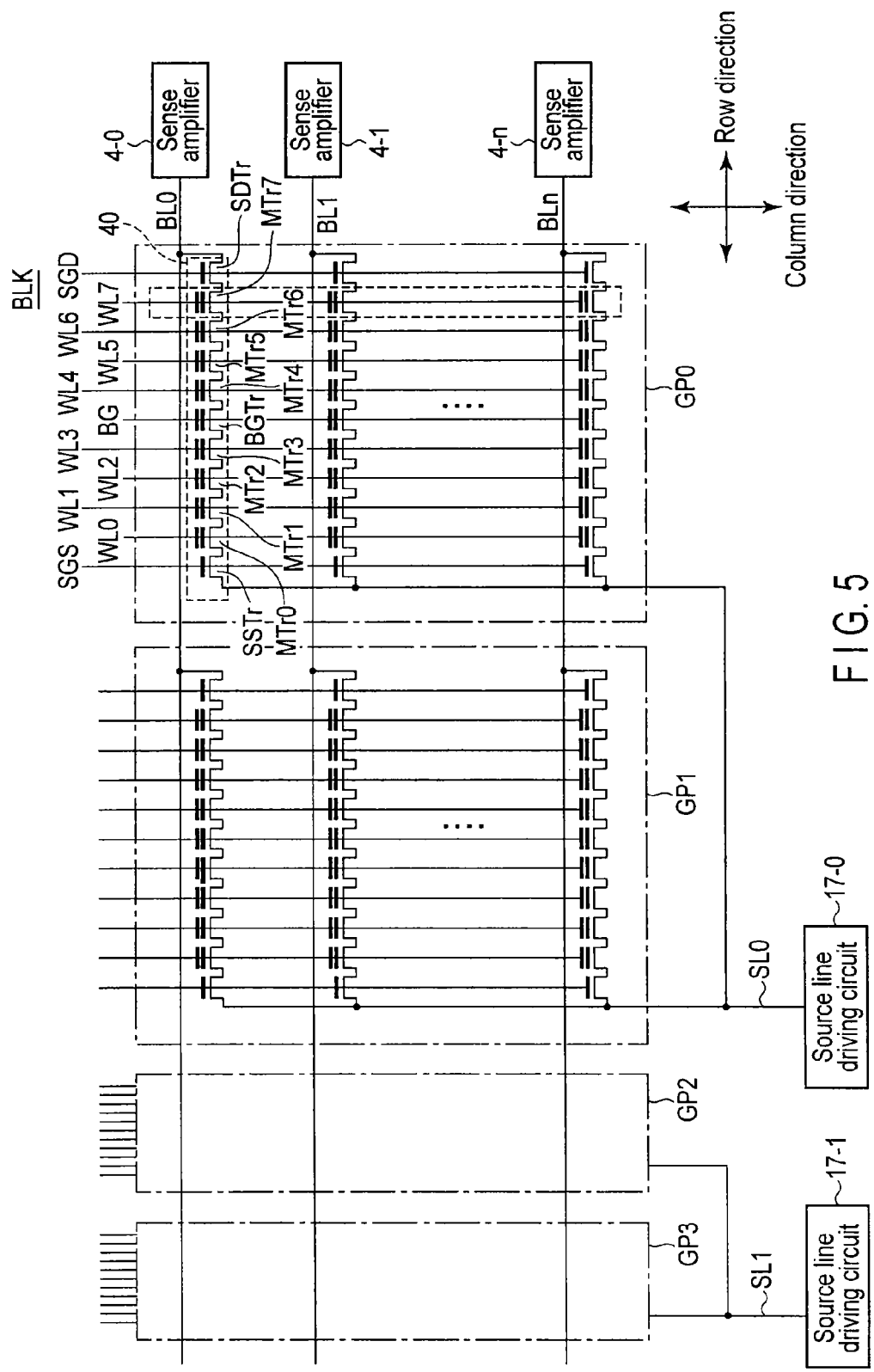
FIG. 5 is a circuit diagram illustrating blocks according to the first embodiment.

FIG. 5 is a circuit diagram illustrating a block BLK according to the first embodiment.

As shown in FIG. 5, for example, the block BLK includes four memory groups GP0 to 3 arranged in the column direction. Each memory group GP includes n (n is a natural number) NAND strings 40 arranged in the row direction.

For example, the NAND string 40 includes eight memory cell transistors MTr0 to 7, a source side selection transistor SSTr, a drain side selection transistor SDTr, and a back gate transistor BGTr. These memory cell transistors MTr0 to 7, the source side selection transistor SSTr, the drain side selection transistor SDTr, and the back gate transistor BGTr are configured such that the current path is connected in series. One end of the source side selection transistor SSTr is connected to one end side of this current path (in this case, one end of the memory cell transistor MTr0), and one end of the drain side selection transistor SDTr is arranged at the other end side of this current path (in this case, one end of the memory cell transistor MTr7). The back gate transistor BGTr is provided between the memory cell transistor MTr3 and the memory cell transistor MTr4.

The number of memory cell transistors MTr is not limited to eight. For example, 16, 32, 64, or 128 memory cell transistors MTr may be provided. The number of memory cell transistors MTr is not limited. In FIG. 5, the current path of the NAND string 40 is in parallel with the column direction, but in the first embodiment, this is in parallel with the stacking direction as explained later.

The gates of the source side selection transistors SSTr in the same memory group GP are commonly connected to the source side selection gate SGS, and the gates of the drain side selection transistors SDTr are commonly connected to the drain side selection gate SGD. The control gates of the memory cell transistors MTr0 to MTr7 in the same block BLK are commonly connected to the word lines WL0 to WL7, and the control gates of the back gate transistors BT are commonly connected to the back gate BG.

More specifically, the word lines WL0 to WL7 and the back gates BG are commonly connected within the multiple memory groups GP0 to GP3 in the same block BLK, but even in the same block BLK, the source side selection gates SGS and the drain side selection gates SGD are independent for each of the memory groups GP0 to GP3.

Among the NAND strings 40 arranged in a matrix form in the memory cell array 5, the other ends of the current paths of the drain side selection transistors SDTr of the NAND strings 40 arranged in the column direction are commonly connected to any one of the bit lines BL (BL0 to BLn, where n is a natural number). More specifically, the bit line BL commonly connects the NAND strings 40 over multiple blocks BLK. The bit lines BL0 to BLn are respectively connected to the sense amplifiers 4-0 to 4-n at the outside of the memory cell array 5. Accordingly, the voltage levels of the bit lines BL0 to BLn are independently controlled.

The other ends of the current paths of the source side selection transistors SSTr in the memory group GP are commonly connected to the source line SL. In the block BLK, multiple source lines SL (in this case, source lines SL0, SL1) are arranged. The source line SL0 is commonly connected to the other ends of the current paths of the source side selection transistors SSTr within the memory groups GP0, GP1, and the source line SL1 is commonly connected to the other ends of the current paths of the source side selection transistors SSTr in the memory groups GP2, GP3. More specifically, the source line SL commonly connects the NAND strings 40 over two adjacent memory groups GP. The source lines SL0, SL1 are respectively connected to source line driving circuits 17-0, 17-1 at the outside of the memory cell array. Accordingly, the voltage levels of the source lines SL0, SL1 are independently controlled.

It should be noted that the number of source lines SL is not limited thereto. The number of source lines SL is determined in accordance with the number of memory groups GP within the block BLK.

As described above, data of the memory cell transistors MTr in the same block BLK are erased at a time. In contrast, reading and writing of data are performed at a time for the multiple memory cell transistors MTr commonly connected to any one of the word lines WL in any one of the memory groups GP of any one of the blocks BLK. This unit is referred to as a "page".

[Example of Configuration of NAND String According to First Embodiment]

Hereinafter, an example of a configuration of the NAND string 40 according to the first embodiment will be explained with reference to FIGS. 6 and 8.

Figure 6:
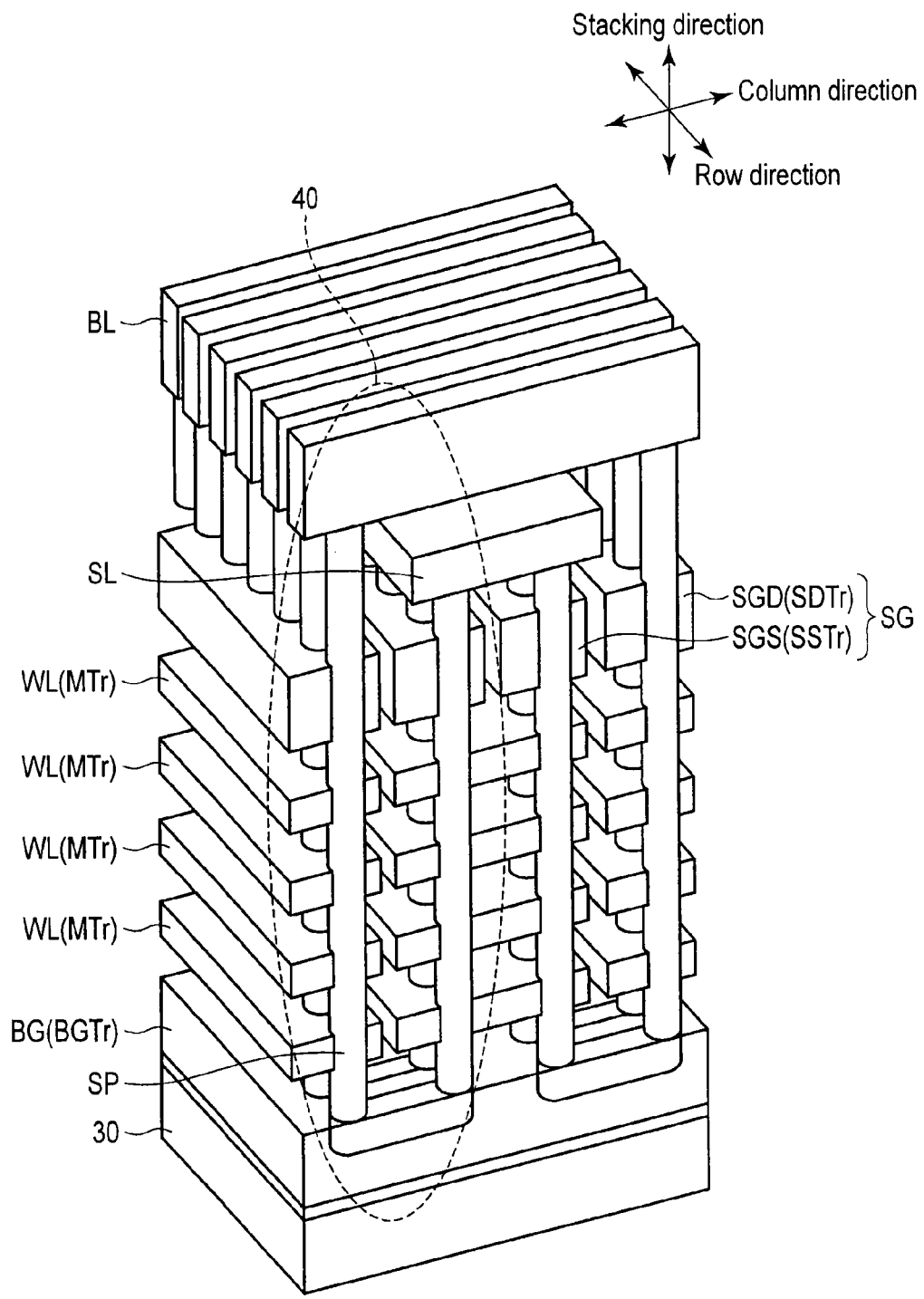
FIG. 6 is a perspective view illustrating a NAND string according to the first embodiment.
Figure 7:
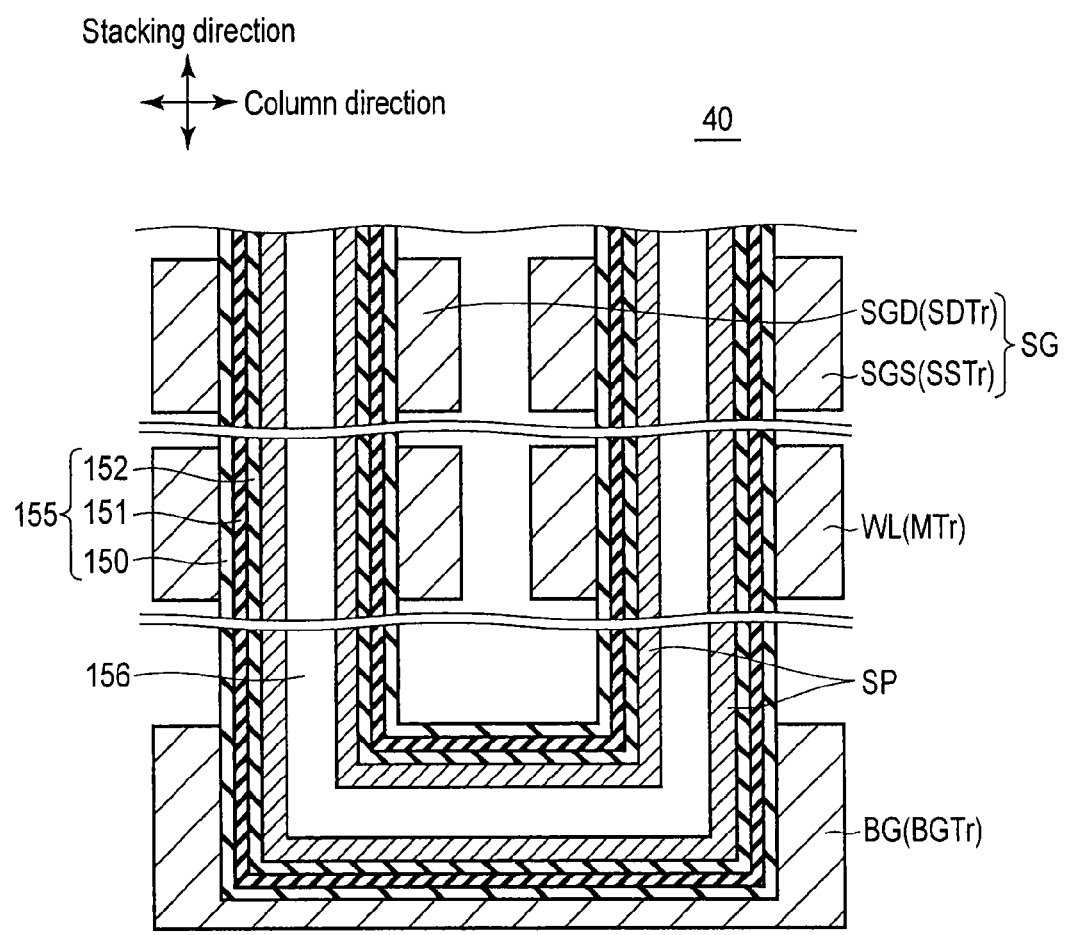
FIG. 7 is an enlarged cross sectional view illustrating the NAND string of FIG. 6.

FIG. 6 is a perspective view illustrating the NAND string 40 according to the first embodiment. FIG. 7 is an enlarged cross sectional view illustrating the NAND string 40 of FIG. 6.

As shown in FIG. 6, the NAND string 40 is formed on a semiconductor substrate 30, and includes a U-shaped silicon pillar (semiconductor layer) SP, a back gate BG, multiple word lines WL, and two selection gates SG (source side selection gate SGS and drain side selection gate SGD).

The U-shaped silicon pillar SP is formed in a memory hole penetrating through the back gate BG, the multiple word lines WL, and the two selection gates SG. This U-shaped silicon pillar SP is formed in a U-shape in a cross section in the column direction. More specifically, the U-shaped silicon pillar SP includes a pair of pillar-shaped portions extending in the stacking direction and a connection portion formed to connect the lower ends of the pair of pillar-shaped portions. The U-shaped silicon pillar SP is arranged such that a straight line connecting the central axes of the pair of pillar-shaped portions is parallel to the column direction. The multiple U-shaped silicon pillars SP are arranged in a matrix form within a plane constituted by the row direction and the column direction.

As shown in FIG. 7, a memory film 155 is formed around the U-shaped silicon pillar SP. This memory film 155 includes a tunnel insulating film 152, a charge accumulation film 151, and a block insulating film 150 formed in this order around the U-shaped silicon pillar SP. In other words, the memory film 155 includes the block insulating film 150, the charge accumulation film 151, and the tunnel insulating film 152 in this order from the inner surface of the memory hole penetrating through the multiple word lines. In the inside of the U-shaped silicon pillar SP, a hollow structure 156 is formed. This hollow structure 156 is filled with an insulating material or metal, or may be hollow.

The back gate BG is formed on the semiconductor substrate 30 with an insulating film, not shown, interposed therebetween, and is arranged below the lowest word lines WL. The back gate BG is formed to cover the connection portion of the U-shaped silicon pillar SP. This back gate BG is constituted by, for example, polysilicon. A back gate transistor BGTr is made at the crossing portion between the back gate BG and the U-shaped silicon pillar SP.

The multiple word lines WL are stacked above the back gate BG with an insulating film layer interposed therebetween, and are arranged to be perpendicular to the pillar-shaped portion of the U-shaped silicon pillar SP. Each word line WL extends in parallel in the row direction. The word lines WL are shared by two adjacent pillar-shaped portions (two pillar-shaped portions at central side) of four pillar-shaped portions of two U-shaped silicon pillars SP adjacent to each other in the column direction, and are formed to be perpendicular thereto. It should be noted that the word lines WL may be formed to be perpendicular to each pillar-shaped portion of the U-shaped silicon pillar SP. The memory cell transistor MTr is formed at a crossing portion between this word line WL and the U-shaped silicon pillar.

The drain side selection gate SGD and the source side selection gate SGS are arranged above the uppermost control gate CG and on the same level. The drain side selection gate SGD and the source side selection gate SGS extend in parallel in the row direction. The drain side selection gate SGD is formed to be perpendicular to one of the pillar-shaped portions of the U-shaped silicon pillar SP, and the source side selection gate SGS is formed to be perpendicular to the other of the pillar-shaped portions thereof. The drain side selection gate SGD and the source side selection gate SGS are line-and-space formed such that they are isolated and separated from each other in the column direction. The drain side selection transistor SDTr is formed at a crossing portion between the drain side selection gate SGD and the U-shaped silicon pillar, and the source side selection transistor SSTr is formed at a crossing section between the source side selection gate SGS and the U-shaped silicon pillar.

A set of multiple NAND strings 40 arranged along the row direction in FIG. 6 corresponds to the memory group GP explained in FIG. 5.

The source line SL is arranged above the source side selection gate SGS. The source lines SL extend in parallel in the row direction, and are line-and-space formed such that they are isolated and separated from each other in the column direction. The source line SL is formed to be shared by two adjacent pillar-shaped portions of four pillar-shaped portions of the two memory cell strings 300 adjacent to each other in the column direction. More specifically, the source line SL is commonly connected to the NAND strings 40 adjacent to each other in the column direction. For this reason, as shown in FIG. 5, the source line SL commonly connects the NAND strings 40 over the two adjacent memory groups GP.

The bit line BL is arranged above the source line SL. Each bit line BL extends in parallel in the column direction, and they are line-and-space formed to be isolated and separated from each other in the column direction.

FIG. 8 is a circuit diagram illustrating the NAND string 40 of FIG. 6.

As shown in FIG. 8, the NAND string 40 includes the source side selection transistor SSTr, the drain side selection transistor SDTr, the memory cell transistors MTr0 to MTr7, and the back gate transistor BGTr.

As described above, the memory cell transistors MTr0 to MTr7 are configured such that the current path is connected in series between the source side selection transistor SSTr and the drain side selection transistor SDTr. The back gate transistor BGTr is configured such that the current path is connected in series between the memory cell transistors MTr3 and MTr4.

More specifically, each of the current path of the memory cell transistors MTr0 to MTr3 and the current path of the memory cell transistors MTr4 to MTr7 is connected in series in the stacking direction. At the lower side in the stacking direction, the back gate transistor BGTr is arranged between the memory cell transistors MTr3 and MTr4, so that the current paths are connected in series. More specifically, along the U-shaped silicon pillar as shown in FIG. 6, the current path of the source side selection transistor SSTr, the drain side selection transistor SDTr, the memory cell transistors MTr0 to MTr7, and the back gate transistor BGTr are connected in series as the NAND string 40. During a data write operation and read operation, the back gate transistor BGTr is changed to an ON state at all times.

The control gates of the memory cell transistors MTr0 to MTr7 are connected to the word lines WL0 to WL7, and the control gate of the back gate transistor BGTr is connected to the back gate BG. The gate of the source side selection transistor SSTr is connected to the source side selection gate SGS, and the gate of the drain side selection transistor SDTr is connected to the drain side selection gate SGD.

[Example of Configuration of Sense Amplifier According to First Embodiment]

Hereinafter, an example configuration of the sense amplifier 4 according to the first embodiment will be explained with reference to FIG. 9.

Figure 9:
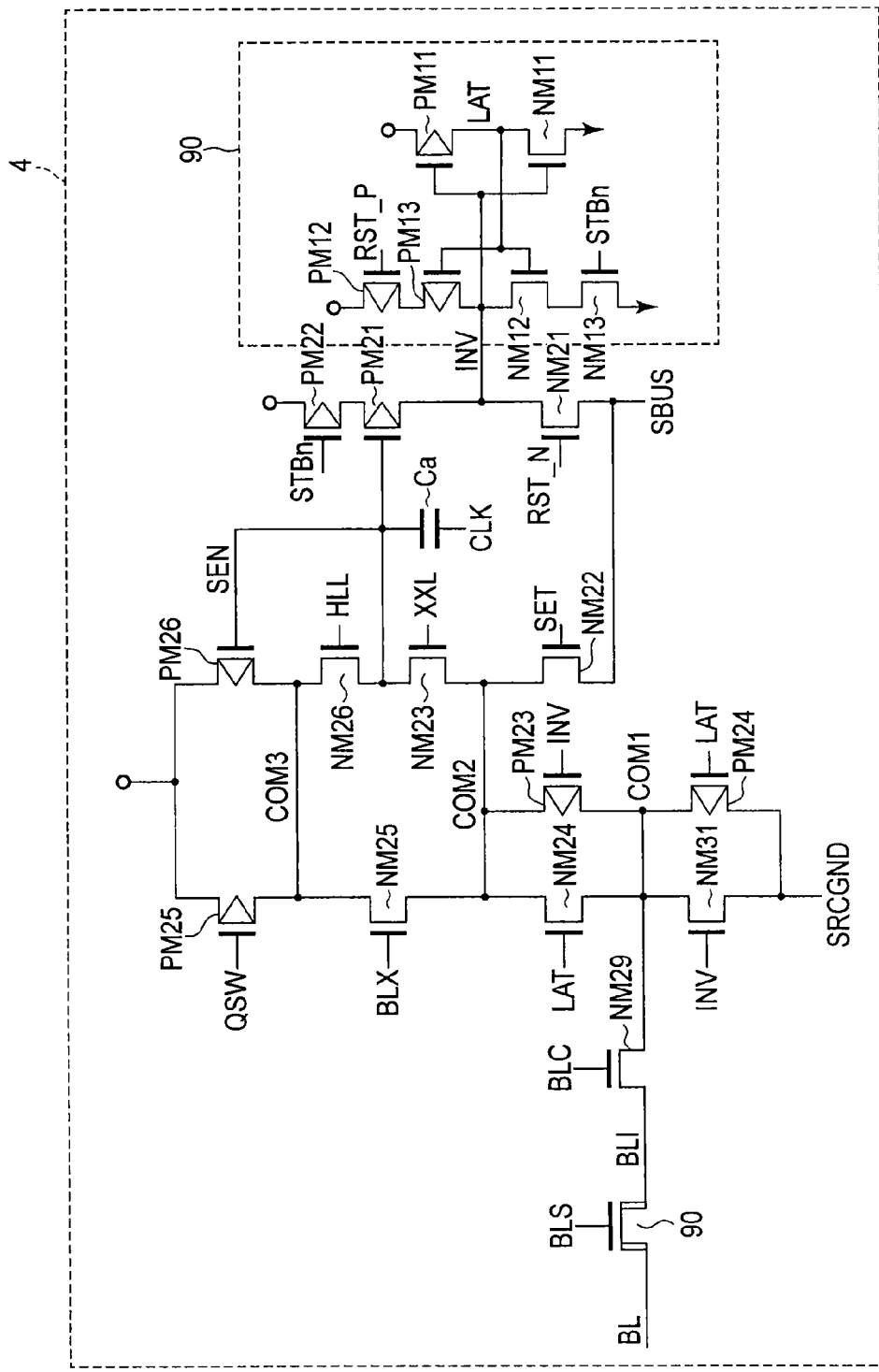
FIG. 9 is a circuit diagram illustrating a sense amplifier according to the first embodiment.

FIG. 9 is a circuit diagram illustrating the sense amplifier 4 according to the first embodiment. The sense amplifier 4 applies a voltage according to operation of a corresponding (connected) bit line BL. In this example, the sense amplifier 4 can apply any one of the voltages Vss, Vsrc, Vbl to the corresponding bit line BL during a read operation. It should be noted that the voltages Vss, Vsrc, Vbl have the following relationship: Vss<Vsrc<Vbl.

In this case, the sense amplifier 4 indicates any one of the sense amplifiers 4-0 to 4-n as shown in FIG. 5. Each of the sense amplifiers 4-0 to 4-n has the same configuration.

As shown in FIG. 9, the sense amplifier 4 has an internal latch circuit 90 holding write data or read data.

The internal latch circuit 90 includes p-channel MOS transistors (hereinafter referred to as PMOS transistors) PM11, PM12, PM13, and n-channel MOS transistors (hereinafter referred to as NMOS transistors) NM11, NM12, NM13.

One end of the current path of the PMOS transistor PM11 is connected to a power supply voltage of the sense amplifier 4, and the other end is connected to one end of the current path of the NMOS transistor NM11. The other end of the current path of the NMOS transistor NM11 is connected to ground (connected to voltage Vss). One end of the current path of the PMOS transistor PM12 is connected to a power supply voltage, and the other end is connected to one end of the current path of the PMOS transistor PM13. The other end of the current path of the PMOS transistor PM13 is connected to one end of the current path of the NMOS transistor NM12. The other end of the current path of the NMOS transistor NM12 is connected to one end of the current path of the NMOS transistor NM13. The other end of the current path of the NMOS transistor NM13 is grounded.

Each gate of the PMOS transistor PM11 and the NMOS transistor NM11 is commonly connected to a connection point between the other end of the current path of the PMOS transistor PM13 and one end of the current path of the NMOS transistor NM12, and a signal INV is given. Each gate of the PMOS transistor PM13 and the NMOS transistor NM12 is commonly connected to a connection point between the other end of the current path of the PMOS transistor PM11 and one end of the current path of the NMOS transistor NM11, and a signal LAT having a phase opposite to the signal INV is given. A signal RST_P is given to the gate of the PMOS transistor PM12, and a signal STBn is given to the gate of the NMOS transistor NM13.

Each gate of the PMOS transistor PM11 and the NMOS transistor NM11 is also commonly connected to a connection point between one end of the current path of the PMOS transistor PM21 and one end of the current path of the NMOS transistor NM21.

The other end of the current path of the PMOS transistor PM21 is connected to a power supply voltage of the sense amplifier 4 via the PMOS transistor PM22. The other end of the current path of the NMOS transistor NM21 is connected to one end of the current path of the NMOS transistor (SET transistor) NM22, and is also connected to a data bus (SBUS line). Accordingly, a signal BUS is given to the other end of the current path of the NMOS transistor NM21 and one end of the current path of the NMOS transistor NM22.

A signal RST_N is given to the gate of the NMOS transistor NM21, and a signal STBn is given to the gate of the PMOS transistor PM22. One of electrodes of a capacitor Ca is connected to the gate of the PMOS transistor PM21, and a potential (signal SEN) at a node SEN is given. A signal CLK which is a clock is given to the other of the electrodes of the capacitor Ca. A signal SET is given to the gate of the NMOS transistor NM22.

The other end of the current path of the NMOS transistor NM22 is connected to a node COM2. More specifically, the other end of the current path of NMOS transistor NM22 is connected to a connection point between one end of the current path of the NMOS transistor NM23 and one end of the current path of the PMOS transistor PM23, and a connection point between one end of the current path of the NMOS transistor NM24 and one end of the current path of the NMOS transistor NM25.

The other end of the current path of the NMOS transistor NM23 is connected to the gate of the PMOS transistor PM21 and one end of the current path of the NMOS transistor NM26. The other end of the current path of the NMOS transistor NM26 is connected to a node COM3. More specifically, the other end of the current path of the NMOS transistor NM26 is connected to a connection point between the other end of the current path of the NMOS transistor NM25 and one end of the current path of the PMOS transistor PM25, and one end of the current path of the PMOS transistor PM26. A power supply voltage is commonly connected to the other end of the current path of the PMOS transistor PM25 and the other end of the current path of the PMOS transistor PM26.

A signal XXL is given to the gate of the NMOS transistor NM23, a signal INV is given to the gate of the PMOS transistor PM23, a signal LAT is given to the gate of the NMOS transistor NM24, a signal BLX is given to the gate of the NMOS transistor NM25, a signal HLL is given to the gate of the NMOS transistor NM26, a signal QSW is given to the gate of the PMOS transistor PM25, and a signal SEN is given to the gate of the PMOS transistor PM26.

One end of the current path of the NMOS transistor (clamp transistor) NM29, one end of the current path of the NMOS transistor NM31, and one end of the PMOS transistor PM24 are connected to a common connection point between the other end of the current path of the PMOS transistor PM23 and the other end of the current path of the NMOS transistor NM24. The other end of the current path of the NMOS transistor NM29 is connected to one end of the current path of the transistor 90, and a signal BLC is given to the gate thereof. The other end of the current path of the NMOS transistor NM31 is connected to the other end of the PMOS transistor PM24 and a common source line (source line voltage SRCGND), and a signal INV is given to the gate. A signal LAT is given to the gate of the PMOS transistor PM24. The other end of the current path of the transistor 90 is connected to the bit line BL, and a signal BLS is given to the gate. The transistor 90 is a high voltage type.

Each signal is provided by the column decoder 6 or the control circuit 10 corresponding thereto.

[Operation of Sense Amplifier According to First Embodiment]

Hereinafter, operation of the sense amplifier 4 according to the first embodiment will be explained.

In this case, in particular, a read operation of data '1' will be explained.

First, before a memory cell is read, data of the internal latch circuit 90 are reset. More specifically, voltages Vdd, Vddsa are respectively given, as reset signals RST_N, RST_P, to the gates of the NMOS transistor NM21 and the PMOS transistor PM12. Accordingly, the NMOS transistor NM21 is turned on, and the PMOS transistor PM12 is turned off. A voltage Vddsa is given as the signal STBn to the gates of the PMOS transistor PM22 and the NMOS transistor NM13, so that the PMOS transistor PM22 is changed to the OFF state, and the NMOS transistor NM13 is changed to an ON state.

At this occasion, the NMOS transistor NM21 is turned on, and the voltage Vss is given to the SBUS line, and therefore, the potential at the node INV (signal INV) decreases. Accordingly, the PMOS transistor PM11 the gate of which is connected to the node INV is changed to the ON state, and the NMOS transistor NM11 is changed to an OFF state. A voltage Vddsa is given to the node LAT (signal LAT) via the current path of the PMOS transistor PM11 from the power supply voltage. The potential at the node LAT increases, so that the PMOS transistor PM13 the gate of which is connected to the node LAT is changed to the OFF state, and the NMOS transistor NM12 is changed to the ON state.

Accordingly, the ground potential is connected to the node INV via the NMOS transistors NM21, NM12 and NM13, and the voltage Vss is applied thereto. In other words, the potential of the node INV is changed to a reset state.

As described above, before the bit line BL is charged, the internal latch circuit 90 is reset. Thereafter, the potential of the reset signal RST_N is reduced (to the voltage Vss) so as not to turn on the NMOS transistor NM21.

Subsequently, the bit line BL is precharged. Since the voltage Vss is given to the node INV, a signal INV of 'L' level is given to the gate of the PMOS transistor PM23, and a signal LAT of 'H' level is given to the gate of the NMOS transistor NM24. A signal QSW of 'L' level is given to the gate of the PMOS transistor PM25, and a signal of 'H' level is given as the signal BLX to the gate of the NMOS transistor NM25. A signal of 'H' level is given as the signal BLC to the gate of the clamp transistor NM29. Accordingly, each of the PMOS transistor PM23, the NMOS transistor NM24, the PMOS transistor PM25, the NMOS transistor NM25, and the NMOS transistor NM29 is changed to the ON state. A sufficiently high voltage is given to the gate of the transistor 90 so that the transistor 90 is turned on, whereby the transistor 90 is changed to the ON state.

At this occasion, the bit line BL is charged to a predetermined potential via the current path of the PMOS transistor PM25, the NMOS transistor NM25, the PMOS transistor PM23, the NMOS transistor NM24, the NMOS transistor NM29, and the transistor 90. As explained later, the predetermined potential of the bit line BL is determined according to the potential of the signal BLC given to the gate of the NMOS transistor NM29. The details of precharge during a read operation according to the first embodiment will be explained later.

A signal HLL of 'H' level is given to the gate of the NMOS transistor NM26, so that the NMOS transistor NM26 is changed to the ON state. Accordingly, the capacitor Ca is charged, and the voltage Vddsa is applied to the node SEN. The PMOS transistor PM22 is in the OFF state.

Subsequently, the node SEN is discharged. More specifically, the NMOS transistor NM26 is changed to the OFF state. At this occasion, the NMOS transistor NM23 is in the ON state. Then, the node SEN is discharged with a current flowing through the bit line BL from the node SEN. After a predetermined period of time passes, the NMOS transistor NM23 is changed to the OFF state, and then the discharging of the node SEN is finished. After the finish of the discharge, the potential at the node SEN decreases to a potential dependent on the current flowing through the bit line BL. The current flowing through the memory cell is denoted as a current Icell, and a reference current for distinguishing ON/OFF states between a current of the memory cell which is deemed as the ON state and a current of the memory cell which is deemed as the OFF state is denoted as a current Iref. A voltage given to the node SEN when the node SEN is discharged with the current Iref is denoted as a voltage Vref. At this occasion, when the memory cell is in the ON state (Icell>Iref), a voltage equal to or less than the voltage Vref is given to the node SEN, and when the memory cell is in the OFF state (Icell<Iref), a voltage equal to or more than the voltage Vref is given to the node SEN. The voltage Vref is set so that the difference between the voltage Vddsa and the voltage Vref is equal to the absolute value of the threshold value voltage of the PMOS transistor PM21 (Vdd-Vref=|Vtp|).

Subsequently, the data of the memory cell are sensed (read). The voltage Vss is given as the signal STB to the gate of the PMOS transistor PM22, so that the PMOS transistor PM22 is changed to the ON state. When the cell current Icell is more than Iref, a voltage equal to or less than the voltage Vref is given to the node SEN. Accordingly, the PMOS transistor PM21 is changed to the ON state. Therefore, the voltage Vdd is given to the node INV via the PMOS transistor PM22 and the PMOS transistor PM21. As a result, the voltage Vdd is given to the gates of the PMOS transistor PM11 and the NMOS transistor NM11, so that the PMOS transistor PM11 is changed to the OFF state, and the NMOS transistor NM11 is changed to the ON state. Accordingly, the ground potential is connected to the node LAT via the NMOS transistor NM11, and the voltage Vss is applied thereto.

At this occasion, since the voltage Vss is given to the gate of the PMOS transistor PM12, the PMOS transistor PM12 is in the ON state. Since the voltage Vss is given to the gate of the PMOS transistor PM13, the PMOS transistor PM13 is in the ON state. Since the voltage Vss is given to the gate of the NMOS transistor NM12, the NMOS transistor NM12 is in the OFF state. Since the voltage Vss is given to the gate of the NMOS transistor NM21, the NMOS transistor NM21 is in the OFF state.

As described above, the internal latch circuit 90 continues to maintain the voltage Vdd. More specifically, the internal latch circuit 90 continues to maintain data '1'.

Then, the voltage Vdd is given to the gate of the NMOS transistor NM31, and the NMOS transistor NM31 is changed to the ON state, and the bit line BL is dropped to the voltage Vsrc.

As described above, a data read operation is performed by sensing the potential at the node SEN using the current of the memory cell after the node SEN is discharged. More specifically, the data read operation is performed by sensing the current flowing through the bit line BL.

The value of the voltage Vref can be changed by the time from when the NMOS transistor NM26 is changed to the OFF state to when the NMOS transistor NM23 is changed to the OFF state and the value of the capacitor Ca.

When data held by the internal latch circuit 90 are data '1', the node INV is at the 'H' level. Accordingly, the NMOS transistor NM31 the gate of which receives a voltage of 'H' level attains the ON state. Therefore, the bit line BL is connected to the voltage Vsrc via the current path of the NMOS transistor NM31. When data held by the internal latch circuit 90 are data '0', the node INV is at the 'L' level. Accordingly, the NMOS transistor NM31 the gate of which receives a voltage of 'L' level attains the OFF state. Therefore, the bit line BL is not connected to the voltage Vsrc.

[Precharge in Read Operation According to First Embodiment]

Hereinafter, precharge in a read operation according to the first embodiment will be explained with reference to FIGS. 9 and 10.

Figure 10:
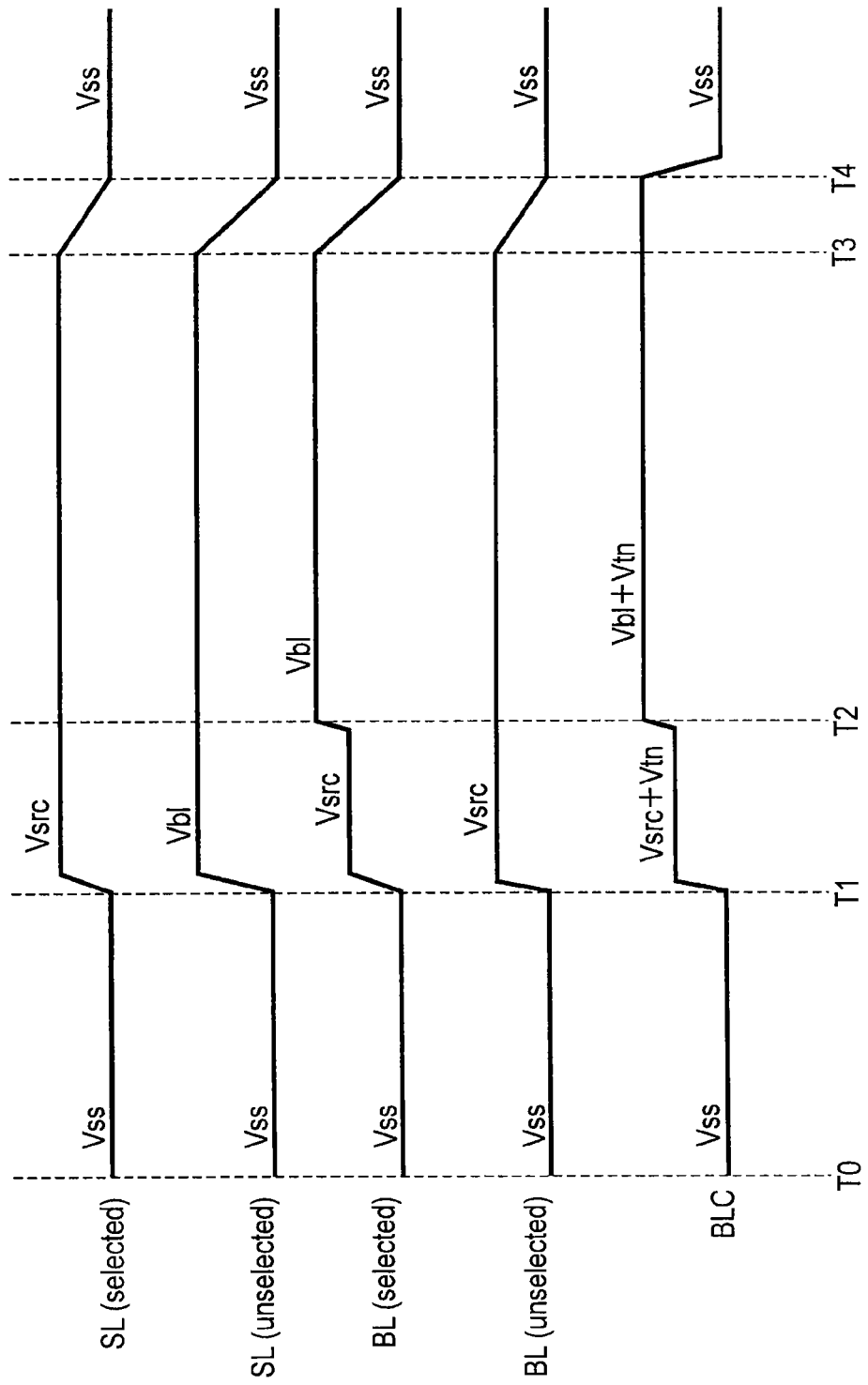
FIG. 10 is a timing chart illustrating precharge in a read operation according to the first embodiment.

FIG. 10 is a timing chart illustrating precharge in a read operation according to the first embodiment. In this case, precharge to a selected source line SL (for example, source line SL0) and a selected bit line BL (for example, bit line BL0) connected to a read-target memory cell and an unselected source line SL (for example, source line SL1) and an unselected bit line BL (for example, bit lines BL1 to BLn) connected to the other non-read-target memory cell will be explained.

In the first embodiment, voltages applied to the selected source line SL0 and the unselected source line SL1 are independently controlled by the source line driving circuits 17-0, 17-1 connected thereto, respectively, and voltages applied to the selected bit line BL0 and the unselected bit lines BL1 to BLn are independently controlled by the sense amplifiers 4-0 to 4-n connected thereto.

In the timing chart below, a sufficiently high voltage is constantly applied to the gates of the transistors 90 of the sense amplifiers 4-0 to 4-n respectively connected to the selected bit line BL0 and unselected bit lines BL1 to BLn, so that the transistors 90 are in the ON state.

The voltage Vss is applied to the selected bit line BL0 and the unselected bit lines BL1 to BLn via the NMOS transistor NM31 (grounded). When the voltages Vsrc, Vbl are applied to the selected bit line BL0, the voltages Vsrc, Vbl are applied to via the PMOS transistor PM25, the NMOS transistor NM25, and the PMOS transistor PM23, and when the voltage Vss is applied, the voltage Vss is applied via the NMOS transistor NM31. On the other hand, when Vsrc, Vss are applied to the unselected bit lines BL1 to BLn, the voltages Vss, Vsrc are applied via the NMOS transistor NM31.

As shown in FIG. 10, first, at a time T0, the voltage Vss is applied to the selected source line SL0 and the unselected source line SL1. The voltage Vss is applied to the selected bit line BL0 and unselected bit lines BL1 to BLn.

Subsequently, at a time T1, the voltage Vsrc is applied to the selected source line SL0, and the voltage Vbl is applied to the unselected source line SL1. This voltage Vbl is at about the same level as the voltage thereafter applied to the selected bit line BL0, and is higher than the voltage Vsrc.

On the other hand, the voltage Vtn+Vsrc (Vtn is a threshold value voltage of the NMOS transistor NM29) is given as the signal BLC to the gate of the NMOS transistor NM29. Accordingly, the voltage Vsrc is applied to the selected bit line BL0 and the unselected bit lines BL1 to BLn.

Subsequently, at a time T2, a voltage Vtn+Vbl is given as the signal BLC. Accordingly, the voltage Vbl is applied to the selected bit line BL0. More specifically, the voltage applied to the selected bit line BL0 increases from the voltage Vsrc to the voltage Vbl. On the other hand, since the NMOS transistors NM24 and PMOS transistor PM23 are in the OFF state, the unselected bit lines BL1 to BLn are still at the voltage Vsrc.

As described above, in the precharge, the voltage Vbl is applied to the selected bit line BL0, and the voltage Vsrc is applied to the selected source line SL0, so that a potential difference is made therebetween. Accordingly, a memory cell connected to the selected bit line BL0 and the selected source line SL0 can be read.

The voltage Vbl of about the same level as the selected bit line BL0 is applied to the unselected source line SL1. Accordingly, a leak current between the selected bit line BL0 and the unselected source line SL1 can be reduced.

Subsequently, at a time T3, the precharge and sense period is finished, and various voltages begin to decrease. At this occasion, the voltages of the selected bit line BL0 and the unselected bit lines BL1 to BLn are discharged via, for example, a node SRCGND.

When the bit line BL and the source line SL can be electrically connected (equalized, short-circuited) via the transistor 50 as explained later in FIG. 12 or FIG. 15, the voltages of the selected bit line BL0 and the unselected bit lines BL1 to BLn may be discharged via the transistor 50 (node BLBIAS).

Thereafter, until a time T4, the voltages of the selected source line SL0 and the unselected source line SL0 decrease to the voltage Vss. Each of the voltages of the selected bit line BL0 and the unselected bit lines BL1 to BLn decrease to the voltage Vss. The signal BLC decreases to the voltage Vss.

As described above, the precharge in the read operation according to the first embodiment is finished.

[Advantages of First Embodiment]

According to the first embodiment, in the precharge during a read operation of the three-dimensional NAND flash memory, the selected bit line BL is precharged after the unselected source line SL is precharged. More specifically, at the time T1, the voltage Vbl is applied to the unselected source line SL, and thereafter, at the time T2, the voltage Vbl of about the same level as the unselected source line SL is applied to the selected bit line BL. Accordingly, this can suppress the effect of coupling due to the unselected source line SL in the precharge of the selected bit line BL, and can suppress over precharge. As a result, the reliability of the read operation can be improved.

In the first embodiment, the selected bit line BL is precharged in two steps (hereinafter referred to as the first precharge and the second precharge). More specifically, at the same time as the precharge to the selected source line SL and the unselected source line SL at the time T1, the first precharge is performed on the selected bit line BL, and thereafter, the second precharge is performed on the selected bit line BL at the time T2. Accordingly, as compared with precharge in one step, the power consumption can be suppressed.

In this case, in the first precharge, due to the coupling with the selected source line SL and the unselected source line SL, the selected bit line BL may be increased to a level higher than a desired voltage (voltage Vsrc) of the first precharge. However, even when the selected bit line BL is boosted to a level equal to or more than the voltage Vsrc in the first precharge, no problem would be caused if it is not boosted to a level higher than a desired voltage (voltage Vbl) of the second precharge.

In the first embodiment, the selected bit line BL is precharged in two steps, but the embodiment is not limited thereto. More specifically, in terms of suppressing over discharge of the bit line BL, it may be after the unselected source line SL is precharged, and the selected bit line BL may be precharged to the voltage Vbl in one or three or more steps.

<Second Embodiment>

A nonvolatile semiconductor memory device according to the second embodiment will be explained with reference to FIGS. 11 to 13. The second embodiment is a modification of the first embodiment. The second embodiment is an example in which the potentials of the selected bit line BL and the selected source line SL are equalized (made the same) during the first precharge of the selected bit line BL by providing an equalizer between the selected bit line BL and the selected source line SL. In the second embodiment, explanation about the same features as those of the first embodiment is omitted, and only different features will be explained in particular.

[Example of Configuration of Memory Cell Array According to Second Embodiment]

Hereinafter, an example configuration of the memory cell array 5 according to the second embodiment will be explained with reference to FIG. 11.

Figure 11:
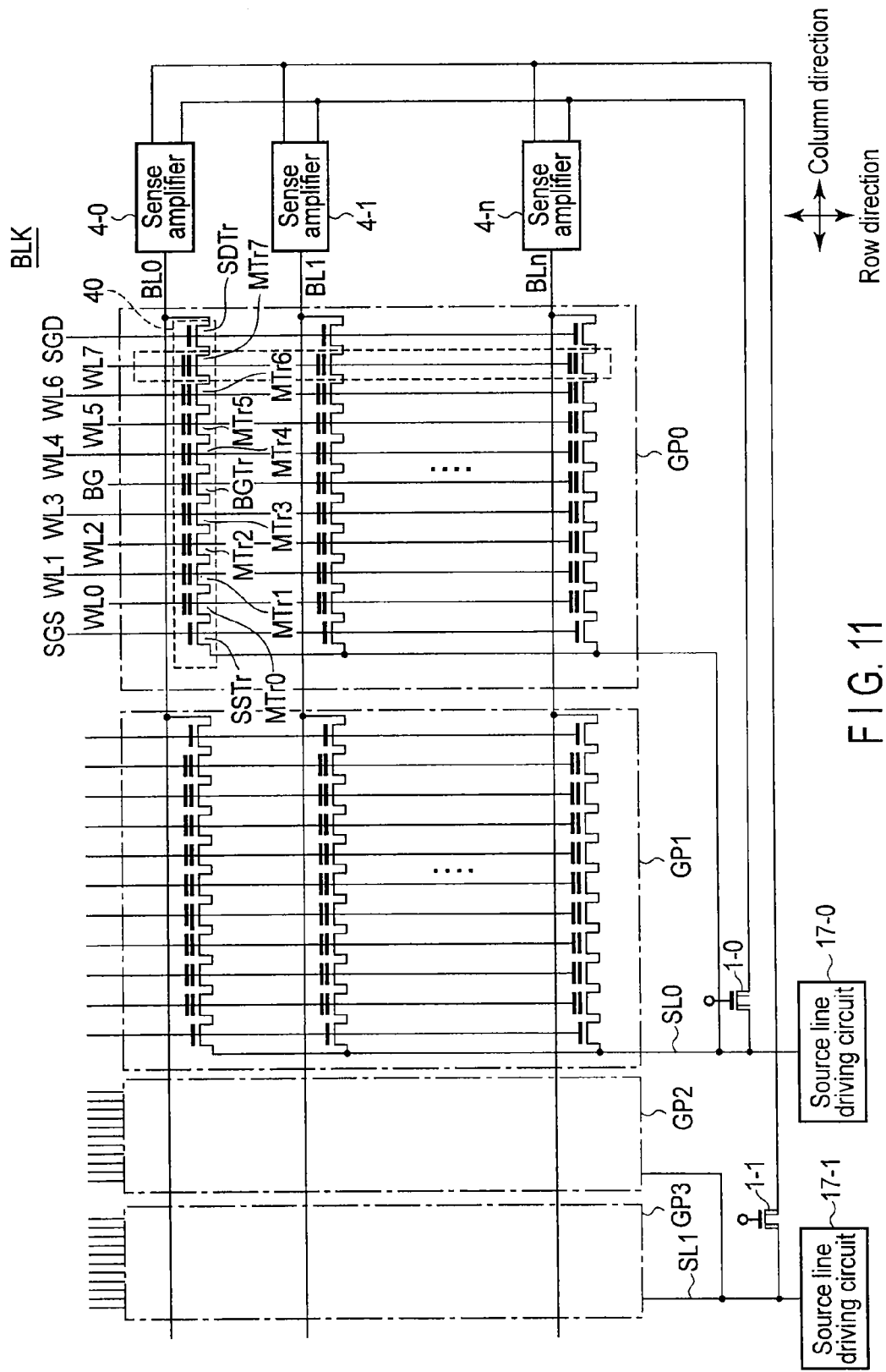
FIG. 11 is a circuit diagram illustrating blocks according to a second embodiment.

FIG. 11 is a circuit diagram illustrating blocks BLK according to the second embodiment.

As shown in FIG. 11, the second embodiment is different from the first embodiment in that the source line SL is connected to the sense amplifier 4.

More specifically, the source line SL0 is connected to the sense amplifiers 4-0 to 4-n via the current path of a high voltage resistance-type transistor 1-0 which serves as a switch. Likewise, the source line SL1 is connected to the sense amplifiers 4-0 to 4-n via the current path of a high voltage resistance-type transistor 1-1 which serves as a switch.

More specifically, the source line SL0 can be connected to the bit lines BL-0 to BL-n via the transistors 50 of the sense amplifiers 4-0 to 4-n explained later by changing the transistor 1-0 into the ON state. The source line SL1 can be connected to the bit lines BL-0 to BL-n via the transistors 50 of the sense amplifiers 4-0 to 4-n by changing the transistor 1-1 into the ON state.

[Example of Configuration and Operation of Sense Amplifier According to Second Embodiment]

Hereinafter, an example configuration and operation of the sense amplifier 4 according to the second embodiment will be explained with reference to FIG. 12.

FIG. 12 is a circuit diagram illustrating the sense amplifier 4 according to the second embodiment.

As shown in FIG. 12, the sense amplifier 4 has a high voltage resistance-type transistor 50 arranged between the bit line BL and the source line SL. One end of the current path of the transistor 50 is connected to the other end of the transistor 90 and the bit line BL, and a signal BIAS is given to the gate. The other end of the current path of the transistor 50 is connected to a node BLBIAS, and is connected to the source lines SL0, SL1 via the transistors 1-0, 1-1, respectively, serving as switches. In a read operation, equalization of the potentials of the bit line BL and the source line SL is controlled by controlling the ON/OFF timing of the transistor 50. More specifically, the transistor 50 functions as an equalizer switch.

FIG. 12 shows a case where, in a read operation, the bit line BL (for example, bit line BL0) and the source line SL0 are selected, and the bit line BL (for example, bit lines BL1 to BLn) and the source line SL1 are unselected. At this occasion, the transistor 1-0 is in an ON state with a sufficiently high voltage applied to the gate at all times in a read operation. For this reason, the equalization of the potentials of the bit line BL0 and the source line SL0 can be controlled by controlling the ON/OFF timing of the transistor 50 of the sense amplifier 4-0 connected to the bit line BL0 selected. On the other hand, the transistor 1-1 is in the OFF state at all times in a read operation. Therefore, in spite of ON/OFF of the transistor 50 of the sense amplifier 4-0 connected to the bit line BL0, the potentials of the bit line BL0 and the source line SL1 are not equalized.

More specifically, in a read operation, the equalization of the potentials of the bit line BL0 and the source line SL0 can be controlled by setting the ON/OFF state of the transistor 1-0 connected to the source line SL0 and then controlling the ON/OFF timing of the transistor 50 of the sense amplifier 4-0. The equalization of the potentials of the bit line BL0 and the source line SL1 can be controlled by setting the ON/OFF state of the transistor 1-1 connected to the source line SL1 and then controlling the ON/OFF timing of the transistor 50 of the sense amplifier 4-0.

[Precharge in Read Operation According to Second Embodiment]

Hereinafter, precharge in a read operation according to the second embodiment will be explained with reference to FIGS. 12 and 13.

FIG. 13 is a timing chart illustrating precharge in a read operation according to the second embodiment. In this case, precharge to a selected source line SL (for example, source line SL0) and a selected bit line BL (for example, bit line BL0) connected to a read-target memory cell and an unselected source line SL (for example, source line SL1) and an unselected bit line BL (for example, bit lines BL1 to BLn) other than the above will be explained.

In the timing chart below, a sufficiently high voltage is constantly applied to the gates of the transistors 90 of the sense amplifiers 4-0 to 4-$n$ respectively connected to the selected bit line BL0 and unselected bit lines BL1 to BLn, so that the transistors 90 are in the ON state.

In the timing chart below, a sufficiently high voltage is constantly applied to the gates of the transistor 1-0 connected between the sense amplifiers 4-0 to 4-$n$ and the selected source line SL0, so as to make it in the ON state. More specifically, a sufficiently high voltage required to pass the voltage Vsrc is applied. On the other hand, the transistor 1-1 between the unselected source line SL1 and the sense amplifiers 4-0 to 4-$n$ is in the OFF state.

As shown in FIG. 13, first, at a time T0, the voltage Vss is applied to the selected source line SL0 and the unselected source line SL1. The voltage Vss is applied to the selected bit line BL0 and unselected bit lines BL1 to BLn.

Subsequently, at a time T1, the voltage Vsrc is applied to the selected source line SL0, and the voltage Vbl is applied to the unselected source line SL1.

On the other hand, the voltage Vtn+Vsrc is applied as the signal BLC. Accordingly, the voltage Vsrc is applied to the selected bit line BL0 and the unselected bit lines BL1 to BLn.

Further, a voltage VX4 is applied as a signal BIAS to the gate of the transistor 50. This voltage VX4 makes the transistor 50 into the ON state, and is of a sufficiently high level for transferring the voltage Vsrc.

At this occasion, as described above, the transistor 1-0 connected to the selected source line SL0 is in the ON state. Accordingly, the potential of the selected bit line BL0 and the potential of the selected source line SL0 are equalized. In other words, the potential of the node BLBIAS located between the selected bit line BL0 and the selected source line SL0 is changed to the voltage Vsrc. The transistor 1-1 connected to the unselected source line SL1 is in the OFF state. Accordingly, the potential of the selected bit line BL0 and the potential of the selected source line SL1 are not equalized.

On the other hand, the potentials of the unselected bit lines BL1 to BLn and the potential of the selected source line SL0 are equalized. In other words, the potential of the node BLBIAS located between the unselected bit lines BL1 to BLn and the selected source line SL0 is changed to the voltage Vsrc. Since the transistor 1-1 connected to the unselected source line SL1 is in the OFF state, the potentials of the unselected bit lines BL1 to BLn and the potential of the unselected source line SL1 are not equalized.

More specifically, the potentials of all the bit lines BL (selected bit line BL0, unselected bit lines BL1 to BLn) and the potential of the selected source line SL0 are equalized, but the potentials of all the bit lines BL and the potential of the unselected source line SL1 are not equalized.

Subsequently, at a time T2, a voltage Vtn+Vbl is given as the signal BLC. Accordingly, the voltage Vbl is applied to the selected bit line BL0. More specifically, the voltage applied to the selected bit line BL0 increases from the voltage Vsrc to the voltage Vbl.

The voltage Vss is applied as the signal BIAS. Accordingly, the transistor 50 of the sense amplifier 4-0 connected to the selected bit line BL0 and the sense amplifiers 4-1 to 4-$n$ connected to the unselected bit lines BL1 to BLn is changed to the OFF state. More specifically, the selected bit line BL0 and unselected bit lines BL1 to BLn are not in conduction with the node BLBIAS and the selected source line SL0, so that the potentials are not equalized.

Subsequently, at a time T3, the precharge and sense period is finished, and various voltages begin to decrease. At this occasion, a voltage VX4 is applied as the signal BIAS. Accordingly, the potentials of all the bit lines BL and the potential of the selected source line SL0 are equalized, and until the time T4, they are all reduced to the voltage Vss.

Thereafter, at the time T4, the voltage Vss is applied as the signal BIAS. Accordingly, the transistor 50 is changed to the OFF state. More specifically, the selected bit line BL0 is not in conduction with the node BLBIAS and selected source line SL0, so that the potentials are not equalized.

As described above, the precharge in the read operation according to the present embodiment is finished.

[Advantages of Second Embodiment]

According to the second embodiment, the same effects as those of the first embodiment can be obtained.

Further, in the second embodiment, a transistor 50 functioning as an equalizer is provided between the selected bit line BL and the selected source line SL. Accordingly, in the first precharge of the selected bit line BL, the selected bit line BL is made into a conductive state with the selected source line SL, so that the potential of the selected bit line BL and the potential of the selected source line SL are equalized. Accordingly, the potentials of the selected bit line BL and the selected source line SL can be stabilized. More specifically, oscillation of the selected source line SL can be suppressed, and the reliability of the read operation can be improved.

[Precharge in Read Operation According to Second Comparative Example]

As described above, in the three-dimensional stacked memory, the distance between the source line SL and the bit line BL is short, and the effect of capacitive coupling between the bit line BL and the source line SL also increases at the same time. For this reason, as shown in the second comparative example of FIG. 14, when the voltage Vsrc is applied to the selected source line SL and the voltage Vbl is applied to the unselected source line SL at the same time with application of the voltage Vsrc to the unselected bit line BL, the voltage Vsrc+α (α is positive) is applied to the unselected bit line BL due to this capacitive coupling. Because of this kind of over precharge of the unselected bit line BL, the reliability of the read operation is degraded. α in FIG. 14 may not be the same as α as shown in FIG. 1.

In contrast, the third embodiment is provided to solve the above problem by controlling the precharge to the bit line BL and the source line SL during a read operation.

The third embodiment will be hereinafter explained with reference to the drawings. In the drawings, the same portions are denoted with the same reference numerals. Repeated explanation will be made as necessary.

<Third Embodiment>

The nonvolatile semiconductor memory device according to the third embodiment will be explained with reference to FIGS. 15 to 21. The third embodiment is an example in which, in the precharge in the read operation, the potential of the unselected bit line BL and the potential of the selected source line SL are equalized via the two current paths. Accordingly, this can suppress over precharge of the unselected bit line BL due to coupling with the unselected source line SL. Hereinafter, the nonvolatile semiconductor memory device according to the third embodiment will be explained in detail. In the third embodiment, explanation about the same features as those of each embodiment is omitted, and only different features will be explained in particular.

[Example of Configuration of Sense Amplifier According to Third Embodiment]

Hereinafter, an example configuration of the sense amplifier 4 according to the third embodiment will be explained with reference to FIG. 15.

Figure 15:
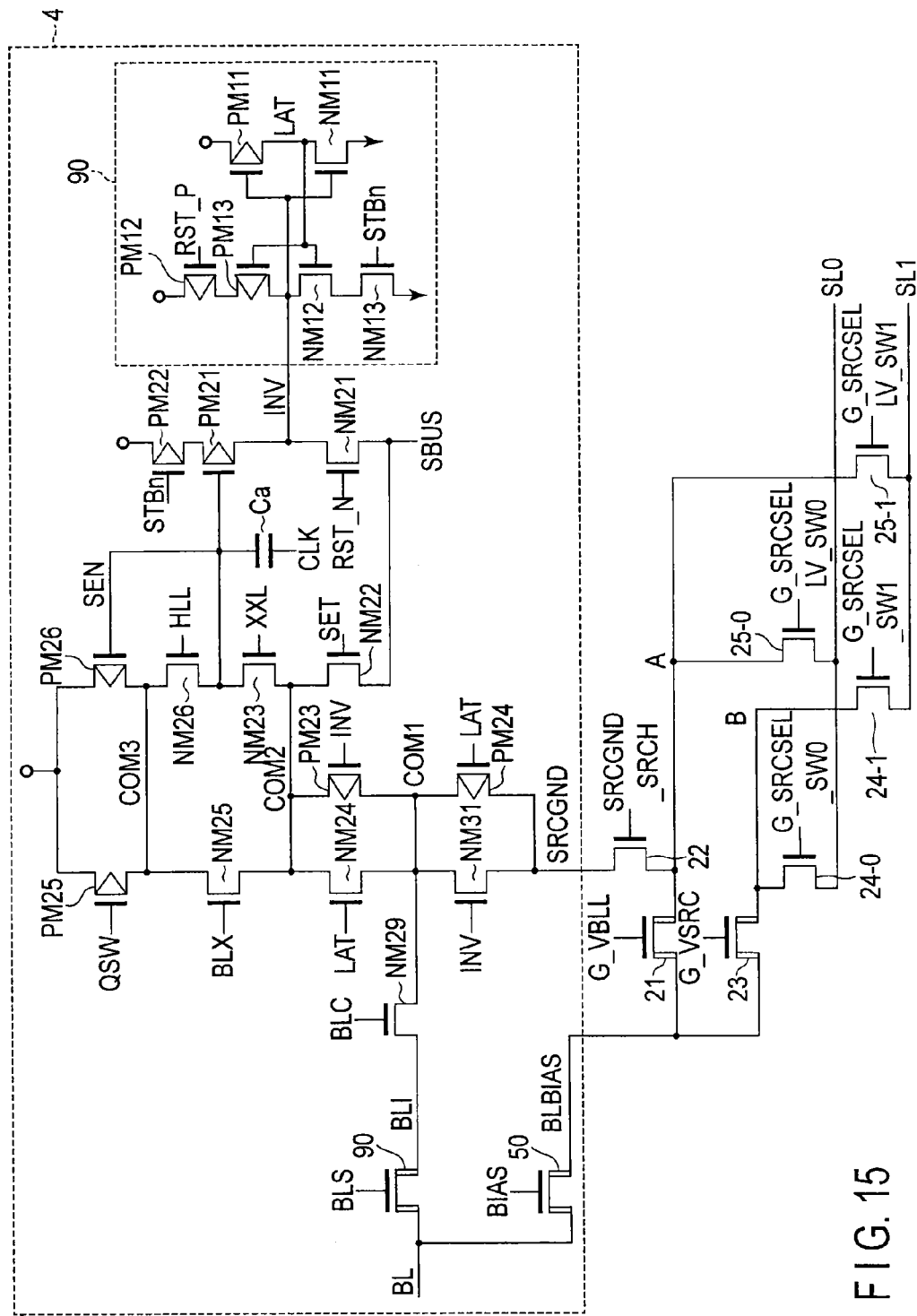
FIG. 15 is a circuit diagram illustrating a sense amplifier according to a third embodiment.

FIG. 15 is a circuit diagram illustrating the sense amplifier 4 according to a third embodiment.

As shown in FIG. 15, in the third embodiment, the sense amplifier 4 (sense amplifiers 4-0 to 4-n) has a high voltage resistance-type transistor 50 arranged between the bit line BL and the source line SL.

One end of the current path of the transistor 50 is connected to the other end of the transistor 90 and the bit line BL, and a signal BIAS is given to the gate. The other end of the current path of the transistor 50 is connected to a node BLBIAS, and is connected to the source lines SL0, SL1 via the transistor 21 serving as a switch arranged in a peripheral circuit. In other words, one end of the current path of the transistor 21 is connected to the node BLBIAS, and the other end is connected to the node A. A signal G_VBLL is given to the gate of the transistor 21.

On the other hand, the other end of the current path of the NMOS transistor NM31 and the other end of the current path of the PMOS transistor PM24 are connected to the source lines SL0, SL1 via the transistor 22 serving as a switch arranged in the peripheral circuit. In other words, one end of the current path of the transistor 22 is connected to a node SRCGND, and the other end is connected to a node A. More specifically, the other end of the current path of the transistor 22 is connected to the other end of the current path of the transistor 21. A signal SRCGND_SRCH is given to the gate of the transistor 22.

The source lines SL0, SL1 are connected via the transistors 25-0, 25-1, respectively, to the node A. In other words, one end of the current path of the transistor 25-0 is connected to the node A, and the other end is connected to the source line SL0. One end of the current path of the transistor 25-1 is connected to the node A, and the other end is connected to the source line SL1. A signal G_SRCSEL_LV_SW0 is given to the gate of the transistor 25-0, and a signal G_SRCSEL_LV_SW1 is given to the gate of the transistor 25-1.

On the other hand, one end of the current path of the transistor 23 is connected to the node BLBIAS (one end of the current path of the transistor 21). The other end of the current path of the transistor 23 is connected to the node B. A signal G_VSRC is given to the gate of the transistor 23.

The source lines SL0, SL1 are connected via the transistors 24-0, 24-1, respectively, to the node B. In other words, one end of the current path of the transistor 24-0 is connected to the node B, and the other end is connected to the source line SL0. One end of the current path of the transistor 24-1 is connected to the node B, and the other end is connected to the source line SL1. A signal G_SRCSEL_SW0 is given to the gate of the transistor 24-0, and a signal G_SRCSEL_SW1 is given to the gate of the transistor 24-1.

In a read operation, equalization of the potentials of the bit line BL and the source line SL is controlled by controlling the ON/OFF timing of the transistor 50 of the sense amplifier 4 by way of the node BLBIAS. More specifically, the transistor 50 functions as an equalizer switch.

In a read operation, equalization of the potentials of the bit line BL and the source line SL is controlled by controlling the ON/OFF timing of the NMOS transistors NM31, NM29 of the sense amplifier 4 by way of the node SRCGND.

As described above, in the third embodiment, in a read operation, the potentials of the bit line BL and the source line SL are equalized with the current path via the node BLBIAS and the current path via the node SRCGND.

Each signal is provided by the column decoder 6 or the control circuit 10 corresponding thereto.

[Precharge in Read Operation According to Third Comparative Example]

Hereinafter, precharge in a read operation according to the third comparative example will be explained with reference to FIGS. 16 and 18.

Figure 16:
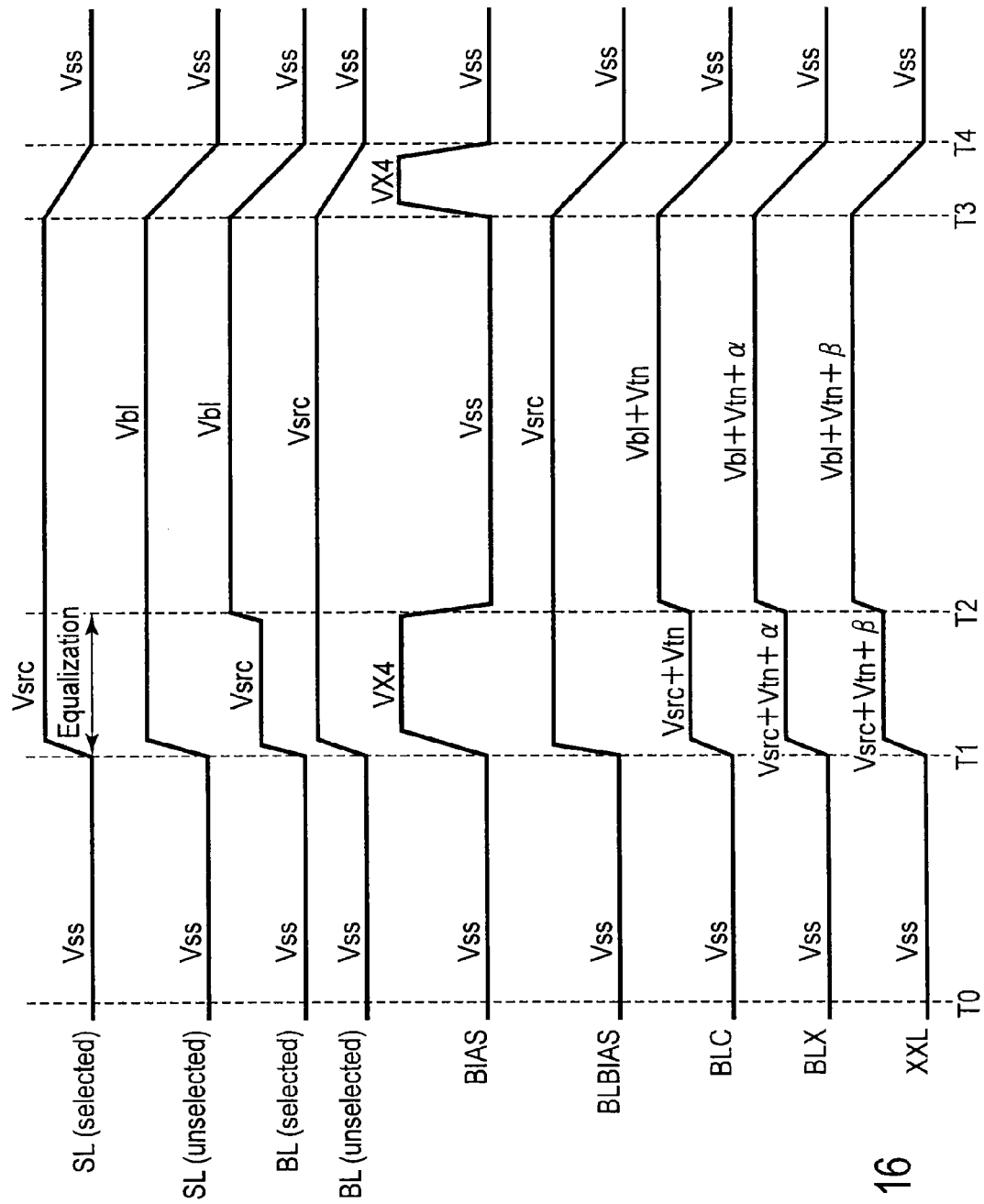
FIG. 16 is a timing chart illustrating precharge in a read operation according to a third comparative example.
Figure 17:
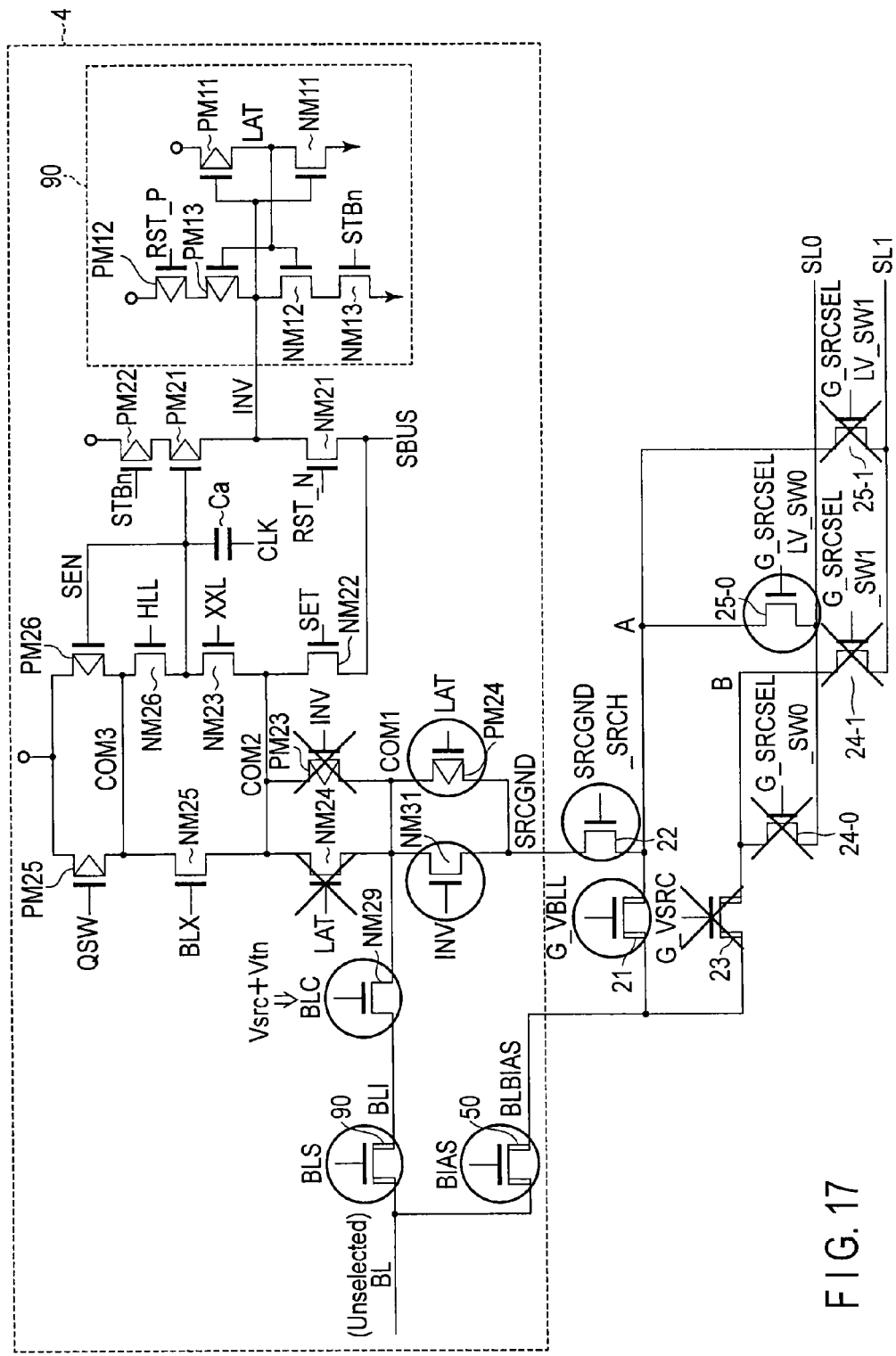
FIG. 17 is a circuit diagram illustrating an equalization operation of a sense amplifier connected to an unselected bit line according to the third comparative example.

FIG. 16 is a timing chart illustrating precharge in a read operation according to the third comparative example. FIG. 17 is a circuit diagram illustrating an equalization operation of the sense amplifier 4 connected to the unselected bit line BL according to the third comparative example. FIG. 18 is a circuit diagram illustrating an equalization operation of the sense amplifier 4 connected to a selected bit line BL according to the third comparative example.

In this case, precharge to a selected source line SL (for example, source line SL0) and a selected bit line BL (for example, bit line BL0) connected to a read-target memory cell and an unselected source line SL (for example, source line SL1) and an unselected bit line BL (for example, bit lines BL1 to BLn) other than the above will be explained.

Voltages applied to the selected source line SL0 and the unselected source line SL1 are independently controlled by the source line driving circuits 17-0, 17-1 connected thereto, respectively, and voltages applied to the selected bit line BL0 and the unselected bit lines BL1 to BLn are independently controlled by the sense amplifiers 4-0 to 4-n connected thereto.

In the timing chart below, a sufficiently high voltage is constantly applied to the gates of the transistors 90 of the sense amplifiers 4-0 to 4-n respectively connected to the selected bit line BL0 and unselected bit lines BL1 to BLn, so that the transistors 90 are in the ON state.

The voltage Vss is applied to the selected bit line BL0 and the unselected bit lines BL1 to BLn via the NMOS transistor NM31 and the PMOS transistor PM24 (grounded) in advance. When the voltages Vsrc, Vbl are mainly applied to the selected bit line BL0, the voltages Vsrc, Vbl are applied via the PMOS transistor PM25, the NMOS transistors NM25, the NMOS transistor NM24, the NMOS transistor NM23, the NMOS transistor NM26, and the PMOS transistor PM23, and when the voltage Vss is applied, the voltage Vss is applied via the NMOS transistor NM31 and the PMOS transistor PM24. On the other hand, when Vsrc, Vss are mainly applied to the unselected bit lines BL1 to BLn, the voltages Vss, Vsrc are applied via the NMOS transistor NM31 and the PMOS transistor PM24.

As shown in FIG. 16, first, at a time T0, the voltage Vss is applied to the selected source line SL0 and the unselected source line SL1. The voltage Vss is applied to the selected bit line BL0 and unselected bit lines BL1 to BLn.

Subsequently, at a time T1, the voltage Vsrc is applied to the selected source line SL0, and the voltage Vbl is applied to the unselected source line SL1. A voltage VX4 is given as a signal BIAS, a voltage Vsrc+Vtn is given as a signal BLC, a voltage Vsrc+Vtn+α (α is positive) is given as a signal BLX, and a voltage Vsrc+Vtn+β (β is positive, β>α) is given as a signal XXL. The voltage VX4 changes the transistor 50 into the ON state, and is of a sufficiently high level for transferring the voltage Vsrc. The voltage Vtn is a threshold value voltage of the NMOS transistor NM29. The relationship of voltages is as follows: VX4>Vbl>Vsrc. Accordingly, the voltage Vsrc is applied to the selected bit line BL0 and the unselected bit lines BL1 to BLn.

More specifically, as shown in FIG. 17, the transistor 90 and the NMOS transistor NM29 are changed to the ON state in the sense amplifiers 4-1 to 4-n connected to the unselected bit lines BL1 to BLn. The node INV is changed to the 'H' level, and the node LAT is changed to the 'L' level, so that the NMOS transistor NM31 and the PMOS transistor PM24 are changed to the ON state. The transistor 22 and the transistor 25-0 connected to the selected source line SL0 are set to the ON state. Accordingly, the voltage Vsrc is applied to the unselected bit lines BL1 to BLn via the transistors 90, 22, 25-0, the NMOS transistors NM29, NM31, and the PMOS transistor PM24. In other words, the potentials of the unselected bit lines BL1 to BLn and the potential of the selected source line SL0 are equalized via the node SRCGND. Since the transistor 25-1 connected to the unselected source line SL1 is set in the OFF state, the potentials of the unselected bit lines BL1 to BLn and the potential of the unselected source line SL1 are not equalized.

The transistor 50 is changed to the ON state in the sense amplifiers 4-1 to 4-n connected to the unselected bit lines BL1 to BLn. The transistor 21 is set to the ON state. Accordingly, the voltage Vsrc is applied to the unselected bit lines BL1 to BLn via the transistors 50, 21, 25-0. In other words, the potential of the node BLBIAS is changed to the voltage Vsrc, and the potentials of the unselected bit lines BL1 to BLn and the potential of the selected source line SL are equalized via the node BLBIAS. The transistors 23, 24-0, 24-1 are set to the OFF state.

Figure 18:
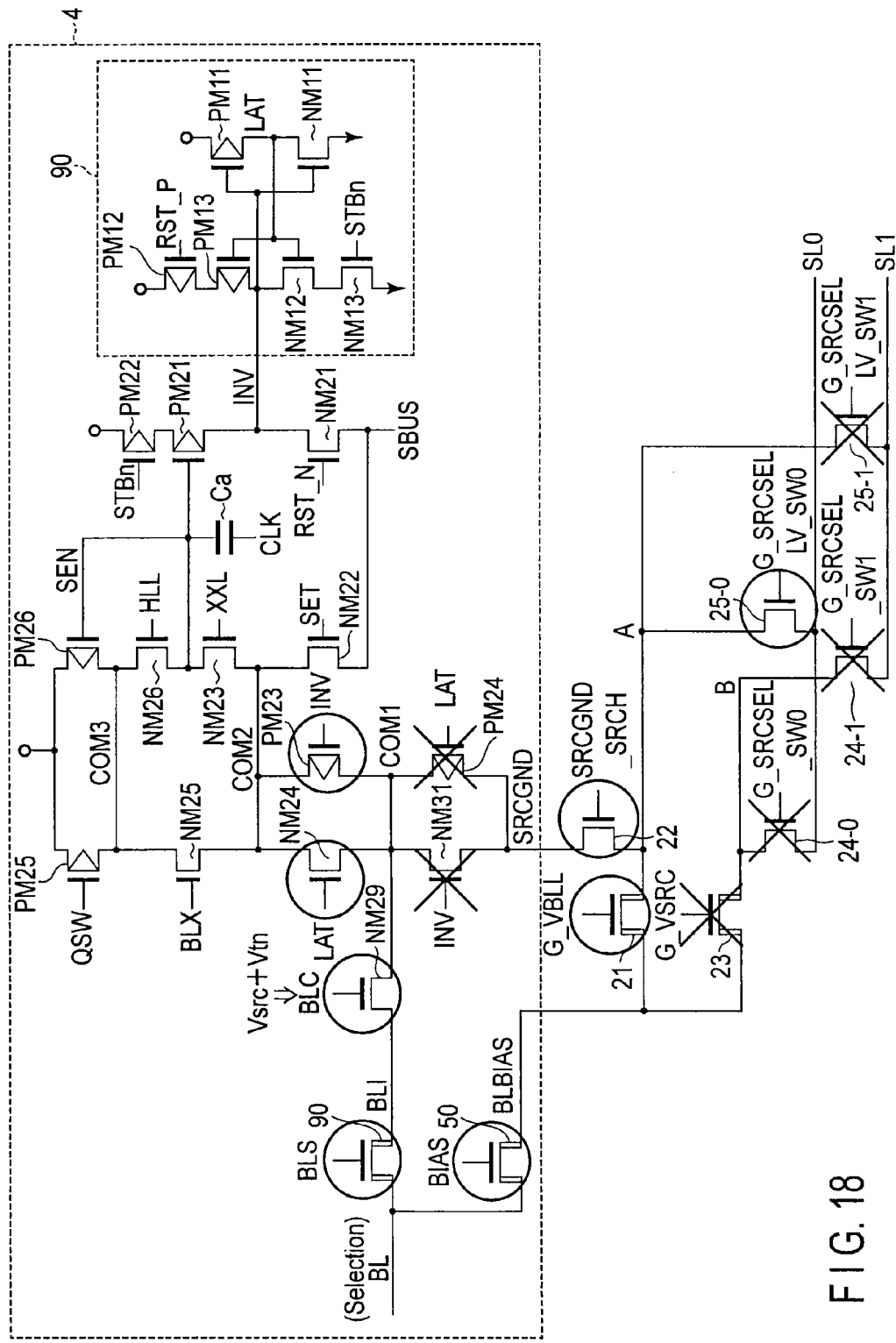
FIG. 18 is a circuit diagram illustrating an equalization operation of a sense amplifier connected to a selected bit line according to the third comparative example.

On the other hand, as shown in FIG. 18, the transistor 90 and the NMOS transistor NM29 are changed to the ON state in the sense amplifier 4-0 connected to the selected bit line BL0. The node INV is changed to the 'L' level, and the node LAT is changed to the 'H' level, so that the NMOS transistors NM24 and the PMOS transistor PM23 are changed to the ON state. The NMOS transistor NM25 and the PMOS transistor PM25 are changed to the ON state. Accordingly, the voltage Vsrc is applied to the selected bit line BL0 from the power supply voltage via the transistor 90, the NMOS transistors NM29, NM24, NM25, and the PMOS transistors PM23, PM25.

The transistor 50 is changed to the ON state in the sense amplifier 4-0 connected to the selected bit line BL0. The transistor 21 and the transistor 25-0 connected to the selected source line SL0 are set to the ON state. Accordingly, the voltage Vsrc is applied to the selected bit line BL0 via the transistors 21, 25-0. In other words, the potential of the node BLBIAS is changed to the voltage Vsrc, and the potential of the selected bit line BL0 and the potential of the selected source line SL are equalized via the node BLBIAS. Since the transistor 25-1 connected to the unselected source line SL1 is set in the OFF state, the potential of the selected bit line BL0 and the potential of the unselected source line SL1 are not equalized. The transistors 23, 24-0, 24-1 are set to the OFF state.

As described above, the potential of the selected bit line BL0 is equalized with the potential of the selected source line SL via the node BLBIAS, and on the other hand, the potentials of the unselected bit lines BL1 to BLn is equalized with the potential of the selected source line SL via the node BLBIAS and the node SRCGND.

Subsequently, at the time T2, a voltage Vbl+Vtn is given as the signal BLC, a voltage Vbl+Vtn+α is given as the signal BLX, and a voltage Vbl+Vtn+β is given as the signal XXL. Accordingly, the voltage Vbl is applied to the selected bit line BL0 from the power supply voltage. More specifically, the voltage applied to the selected bit line BL0 increases from the voltage Vsrc to the voltage Vbl. On the other hand, since the NMOS transistors NM24 and PMOS transistor PM23 are in the OFF state, the unselected bit lines BL1 to BLn are still the at the voltage Vsrc.

The voltage Vss is applied as the signal BIAS. Accordingly, the transistor 50 of the sense amplifier 4-0 connected to the selected bit line BL0 and the sense amplifiers 4-1 to 4-n connected to the unselected bit lines BL1 to BLn is changed to the OFF state. More specifically, the selected bit line BL0 and unselected bit lines BL1 to BLn are not in conduction with the node BLBIAS and the selected source line SL0, so that the potentials are not equalized.

Subsequently, at a time T3, the precharge and sense period is finished, and various voltages begin to decrease. At this occasion, a voltage VX4 is applied as the signal BIAS, so that the transistor 50 is changed to the ON state. The transistors 21, 22, 25-0, 25-1 are set to the OFF state. On the other hand, the transistors 23, 24-0, 24-1 are set to the ON state. Accordingly, the potentials of all the bit lines BL (selected bit line BL0, unselected bit lines BL1 to BLn) and the potentials of all the source lines SL (selected source line SL0, unselected source line SL1) are equalized. More specifically, when the voltages of all the bit lines BL and the voltages of all the source lines SL decrease, the potentials thereof are equalized.

Thereafter, until a time T4, the voltages of all the source lines SL decrease to the voltage Vss. Accordingly, the voltages of all the bit lines equalized with all the source lines SL also decrease to the voltage Vss. The voltage Vss is applied as the signal BIAS. Accordingly, the transistor 50 is changed to the OFF state. More specifically, all the bit lines BL0, the node BLBIAS, and the selected source line SL0 are not in conduction, and the potentials are not equalized.

As described above, the precharge in the read operation according to the third comparative example is finished.

The following problems occur in the precharge in the read operation according to the third comparative example explained above.

According to the third comparative example, as shown in FIG. 17, when the potential of the unselected bit line BL and the potential of the selected source line SL are equalized (time T1 to T2), the first current path via the node SRCGND and the second current path via the node BLBIAS are used.

At this occasion, the voltage Vsrc+Vtn is applied to the gate of the NMOS transistor NM29 in the first current path. Therefore, the NMOS transistor NM29 transfers the voltage Vsrc between the unselected bit line BL and the selected source line SL, and they can be equalized, but the margin of the conductive state is small. More specifically, when the potential of the unselected bit line BL increases to a level higher than the voltage Vsrc due to coupling with the selected source line SL and the unselected source line SL, it is difficult to reduce the potential of the unselected bit line BL via the NMOS transistor NM29 (first current path).

On the other hand, the potential of the unselected bit line BL and the potential of the selected source line SL are also equalized via the second current path. However, the size of the transistor 21 arranged in the second current path is less than the size of the transistor 22 arranged in the first current path. Accordingly, as described above, when the potential of the unselected bit line BL increases to a level higher than the voltage Vsrc, it is also difficult to reduce the potential of the unselected bit line BL via the transistor 22 (second current path).

In contrast, in the third embodiment, not only the second current path but also the first current path in which the size of the transistor is sufficiently large is ensured, so that this suppresses an increase in the potential of the unselected bit line BL. Hereinafter, the precharge in the read operation according to the present embodiment will be explained in detail.

[Precharge in Read Operation According to Third Embodiment]

Hereinafter, precharge in the read operation according to the third embodiment will be explained with reference to FIGS. 19 to 21.

FIG. 19 is a timing chart illustrating precharge in the read operation according to the third embodiment. FIG. 20 is a circuit diagram illustrating an equalization operation of the sense amplifier 4 connected to the unselected bit line BL according to the third embodiment. FIG. 21 is a circuit diagram illustrating an equalization operation of the sense amplifier 4 connected to the selected bit line BL according to the third embodiment.

In this case, precharge to a selected source line SL (for example, source line SL0) and a selected bit line BL (for example, bit line BL0) connected to a read-target memory cell and an unselected source line SL (for example, source line SL1) and an unselected bit line BL (for example, bit lines BL1 to BLn) other than the above will be explained.

Voltages applied to the selected source line SL0 and the unselected source line SL1 are independently controlled by the source line driving circuits 17-0, 17-1 connected thereto, respectively, and voltages applied to the selected bit line BL0 and the unselected bit lines BL1 to BLn are independently controlled by the sense amplifiers 4-0 to 4-n connected thereto.

In the timing chart below, a sufficiently high voltage is constantly applied to the gates of the transistors 90 of the sense amplifiers 4-0 to 4-n respectively connected to the selected bit line BL0 and unselected bit lines BL1 to BLn, so that the transistors 90 are in the ON state.

The voltage Vss is applied to the selected bit line BL0 and the unselected bit lines BL1 to BLn via the NMOS transistor NM31 and the PMOS transistor PM24 (grounded) in advance. When the voltage Vbl is mainly applied to the selected bit line BL0, the voltage Vbl is applied to via the PMOS transistor PM25, the NMOS transistor NM25, the NMOS transistor NM24, the NMOS transistor NM23, the NMOS transistor NM26, and the PMOS transistor PM23, and when the voltage Vss is applied, the voltage Vss is applied via the NMOS transistor NM31 and the PMOS transistor PM24, and when the voltage Vsrc is applied, the voltage Vsrc is applied via the transistor 50. On the other hand, when Vsrc, Vss are mainly applied to the unselected bit lines BL1 to BLn, the voltages Vss, Vsrc are applied via the NMOS transistor NM31 and the PMOS transistor PM24.

As shown in FIG. 19, first, at the time T0, the voltage Vss is applied to the selected source line SL0 and the unselected source line SL1. The voltage Vss is applied to the selected bit line BL0 and unselected bit lines BL1 to BLn.

Subsequently, at a time T1, the voltage Vsrc is applied to the selected source line SL0, and the voltage Vbl is applied to the unselected source line SL1. The voltage VX4 is applied as the signal BIAS, and the voltage VTH is applied as the signal BLC. The voltage VX4 changes the transistor 50 into the ON state, and is of a sufficiently high level for transferring the voltage Vsrc. The voltage VTH changes the NMOS transistor NM29 into the ON state, and is of a sufficiently high level for transferring the voltage Vsrc. The voltage VTH is more than the voltage Vsrc+Vtn according to the second comparative example, and is preferably of a level twice or higher than the voltage Vsrc+Vtn. For example, the voltage VTH is about 3 to 5 V, and the voltage Vsrc+Vtn is about 1.5 to 2 V. It is higher than the voltage applied to the gate of the NMOS transistor NM31 (voltage at 'H' level, for example, voltage Vdd). Accordingly, the voltage Vsrc is applied to the selected bit line BL0 and the unselected bit lines BL1 to BLn.

Figure 20:
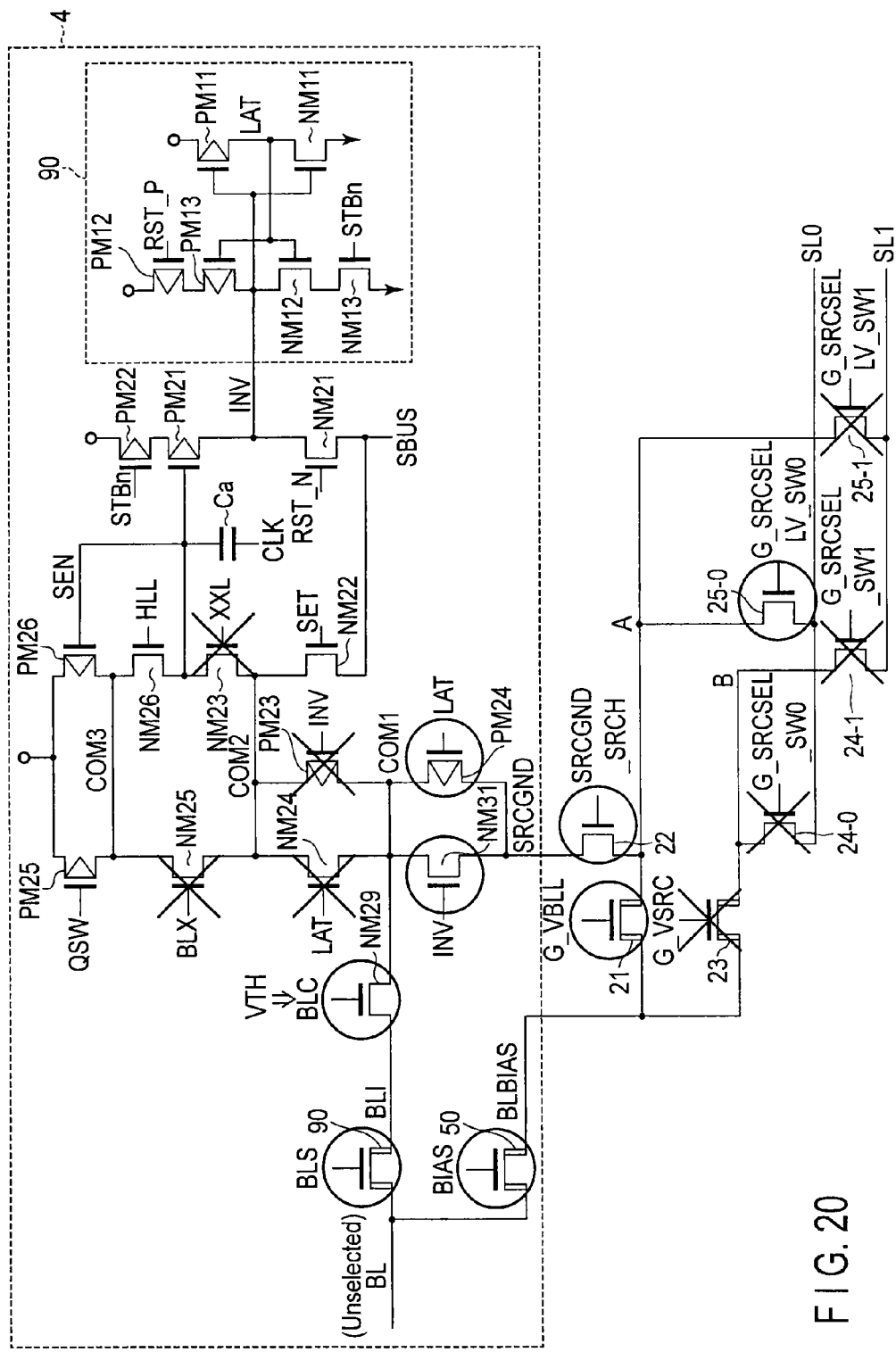
FIG. 20 is a circuit diagram illustrating an equalization operation of a sense amplifier connected to an unselected bit line according to the third embodiment.

More specifically, as shown in FIG. 20, the transistor 90 and the NMOS transistor NM29 are changed to the ON state in the sense amplifiers 4-1 to 4-n connected to the unselected bit lines BL1 to BLn. The node INV is changed to the 'H' level, and the node LAT is changed to the 'L' level, so that the NMOS transistor NM31 and the PMOS transistor PM24 are changed to the ON state. The transistor 22 and the transistor 25-0 connected to the selected source line SL0 are set to the ON state. Accordingly, the voltage Vsrc is applied to the unselected bit lines BL1 to BLn via the transistors 90, 22, 25-0, the NMOS transistors NM29, NM31, and the PMOS transistor PM24. In other words, the potentials of the unselected bit lines BL1 to BLn and the potential of the selected source line SL are equalized via the node SRCGND. Since the transistor 25-1 connected to the unselected source line SL1 is set in the OFF state, the potentials of the unselected bit lines BL1 to BLn and the potential of the unselected source line SL1 are not equalized.

The transistor 50 is changed to the ON state in the sense amplifiers 4-1 to 4-n connected to the unselected bit lines BL1 to BLn. The transistor 21 is set to the ON state. Accordingly, the voltage Vsrc is applied to the unselected bit lines BL1 to BLn via the transistors 50, 21, 25-0. In other words, the potential of the node BLBIAS is changed to the voltage Vsrc, and the potentials of the unselected bit lines BL1 to BLn and the potential of the selected source line SL are equalized via the node BLBIAS. The transistors 23, 24-0, 24-1 are set to the OFF state.

At this occasion, in the present embodiment, the sufficiently high voltage VTH is given as the signal BLC. Therefore, even when the potentials of the unselected bit lines BL1 to BLn increase to levels higher than the voltage Vsrc due to coupling with the unselected source line SL1 and the selected source line SL0, the potentials of the unselected bit lines BL1 to BLn can be reduced via the NMOS transistor NM29 (first current path).

On the other hand, as shown in FIG. 21, the transistor 90 and the NMOS transistor NM29 are changed to the ON state in the sense amplifier 4-0 connected to the selected bit line BL0. The node INV is changed to the 'L' level, and the node LAT is changed to the 'H' level, so that the NMOS transistors NM24 and the PMOS transistor PM23 are changed to the ON state. However, since the voltage Vss is given as the signal BLX and the signal XXL, the NMOS transistors NM25, NM23 are in the OFF state. Therefore, no voltage is supplied from the power supply voltage to the selected bit line BL0.

This is because the sufficiently high voltage VTH is given as the signal BLC. When the NMOS transistor NM25 and the PMOS transistor PM25 are changed to the ON state while the voltage VTH is given as the signal BLC, a voltage Vddsa is applied to the selected bit line BL0 from the power supply voltage. More specifically, by changing the NMOS transistors NM25, NM23 to the OFF state, the selected bit line BL0 is prevented from increasing to a level higher than the voltage Vsrc.

The transistor 50 is changed to the ON state in the sense amplifier 4-0 connected to the selected bit line BL0. The transistor 21 and the transistor 25-0 connected to the selected source line SL0 are set to the ON state. Accordingly, the voltage Vsrc is applied to the selected bit line BL0 via the transistors 21, 25-0. In other words, the potential of the node BLBIAS is changed to the voltage Vsrc, and the potential of the selected bit line BL0 and the potential of the selected source line SL are equalized via the node BLBIAS. Since the transistor 25-1 connected to the unselected source line SL1 is set in the OFF state, the potential of the selected bit line BL0 and the potential of the unselected source line SL1 are not equalized. The transistors 23, 24-0, 24-1 are set to the OFF state.

As described above, the potential of the selected bit line BL0 is equalized with the potential of the selected source line SL via the node BLBIAS, and on the other hand, the potentials of the unselected bit lines BL1 to BLn are equalized with the potential of the selected source line SL via the node BLBIAS and the node SRCGND.

Subsequently, at a time T2', the voltage Vss is given as the signal BLC, and the NMOS transistor NM29 is once changed to the OFF state. This is because discharge of the driver for the signal BLC is slow. More specifically, this is because, when, at the time T2 explained later, the voltage directly drops from the voltage VTH to a voltage Vbl+Vtn explained later as the signal BLC, a voltage higher than the voltage Vbl is applied to the selected bit line BL0 during the voltage drop because the speed of the voltage drop is slow.

Subsequently, at the time T2, the voltage Vbl+Vtn is given as the signal BLC, a voltage Vblx is given as the signal BLX, and a voltage Vxxl is given as the signal XXL. Accordingly, the voltage Vbl is applied to the selected bit line BL0 from the power supply voltage. More specifically, the voltage applied to the selected bit line BL0 increases from the voltage Vsrc to the voltage Vbl. On the other hand, since the NMOS transistors NM24 and PMOS transistor PM23 are in the OFF state, the unselected bit lines BL1 to BLn are still at the voltage Vsrc.

The voltage Vss is applied as the signal BIAS. Accordingly, the transistor 50 of the sense amplifier 4-0 connected to the selected bit line BL0 and the sense amplifiers 4-1 to 4-n connected to the unselected bit lines BL1 to BLn is changed to the OFF state. More specifically, the selected bit line BL0 and unselected bit lines BL1 to BLn are not in conduction with the node BLBIAS and the selected source line SL0, so that the potentials are not equalized.

Subsequently, at a time T3, the precharge and sense period is finished, and various voltages begin to decrease. At this occasion, a voltage VX4 is applied as the signal BIAS, so that the transistor 50 is changed to the ON state. The transistors 21, 22, 25-0, 25-1 are set to the OFF state. On the other hand, the transistors 23, 24-0, 24-1 are set to the ON state. Accordingly, the potentials of all the bit lines BL and the potentials of all the source lines SL are equalized. More specifically, when the voltages of all the bit lines BL and the voltages of all the source lines SL decrease, the potentials thereof are equalized.

Thereafter, until a time T4, the voltages of all the source lines SL decrease to the voltage Vss. Accordingly, the voltages of all the bit lines equalized with all the source lines SL also decrease to the voltage Vss. The voltage Vss is applied as the signal BIAS. Accordingly, the transistor 50 is changed to the OFF state. More specifically, all the bit lines BL0, the node BLBIAS, and the selected source line SL0 are not in conduction, and the potentials are not equalized.

As described above, the precharge in the read operation according to the third embodiment is finished.

[Advantages of Third Embodiment]

According to the third embodiment, in the precharge during the read operation in the three-dimensional NAND flash memory, the potential of the unselected bit line BL and the potential of the selected source line SL are equalized via two current paths. More specifically, the potential of the unselected bit line BL is equalized with the potential of the selected source line SL using the first current path (node SRCGND) via the NMOS transistors NM29, NM31 and the second current path (node BLBIAS) via the transistor 50. Accordingly, the potential of the unselected bit line BL and the selected source line SL can be stabilized. Accordingly, this can suppress the effect of coupling due to the unselected source line SL and the selected source line SL, and can suppress over precharge. As a result, the reliability of the read operation can be improved.

However, the size of the transistor 22 arranged in the first current path is more than the size of the transistor 21 arranged in the second current path. Therefore, when the potential of the unselected bit line BL and the potential of the selected source line SL are equalized, it is preferable to sufficiently ensure the conductive state of the first current path in order to suppress over precharge of the unselected bit line BL.

In contrast, in the third embodiment, the voltage VTH higher than the voltage Vsrc+Vtn applied in the third comparative example is applied to the gate of the NMOS transistor NM29 arranged in the first current path. Therefore, even when the potential of the unselected bit line BL increases to a level higher than the voltage Vsrc due to coupling with the unselected source line SL and the selected source line SL, the potential of the unselected bit line BL can be reduced via the NMOS transistor NM29 (first current path).

In the third embodiment, after the unselected source line SL is precharged, the selected bit line BL is precharged. More specifically, at the time T1, the voltage Vbl is applied to the unselected source line SL, and thereafter, at the time T2, the voltage Vbl of about the same level as the unselected source line SL is applied to the selected bit line BL. Accordingly, this can suppress the effect of coupling due to the unselected source line SL and the selected source line SL in the precharge of the selected bit line BL, and can suppress over precharge.

In the third embodiment, the selected bit line BL is precharged in two steps (hereinafter referred to as the first precharge and the second precharge). More specifically, at the same time as the precharge to the selected source line SL and the unselected source line SL at the time T1, the first precharge is performed on the selected bit line BL, and thereafter, the second precharge is performed on the selected bit line BL at the time T2. Accordingly, as compared with precharge in one step, the power consumption can be suppressed.

In this case, in the first precharge, due to the coupling with the selected source line SL and the unselected source line SL, the selected bit line BL may be increased to a level higher than a desired voltage (voltage Vsrc) of the first precharge. However, even when the selected bit line BL is boosted to a level equal to or more than the voltage Vsrc in the first precharge, no problem would be caused if it is not boosted to a level higher than a desired voltage (voltage Vbl) of the second precharge.

In the third embodiment, the selected bit line BL is precharged in two steps, but the embodiment is not limited thereto. More specifically, in terms of suppressing over discharge of the bit line BL, it may be after the unselected source line SL is precharged, and the selected bit line BL may be precharged to the voltage Vbl in one or three or more steps.

As used herein, the term 'connect' means 'electrically connect'. The term 'connect' does not always refer to a direct connection; it can refer to a connection via components.

A memory cell array formation is disclosed in U.S. patent application Ser. Nos. 12/532,030. 12/532,030, the entire contents of which are incorporated by reference herein. In the case where the memory cell array of U.S. patent application Ser. No. 12/532,030 is applied, since there is only one source line SL, one source line driving circuit 17 is used and the transistors 1-0, 1-1, 24-0, 24-1, 25-0, 25-1 become unnecessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   memory strings formed above the semiconductor substrate, each memory string including a plurality of memory cells, a part of memory cells being configured to stacked above the semiconductor substrate; and
   a control circuit configured to control a plurality of voltages applied to the memory cells,
   wherein in a read operation, when the control circuit precharges a first source line electrically connected to a selected memory string to a first voltage, the control circuit precharges a second source line electrically connected to an unselected memory string to a second voltage, the second voltage being higher than the first voltage, and after the second source line is precharged, the control circuit precharges a first bit line electrically connected to the selected memory string to the second voltage.

2. The device of claim 1, wherein the control circuit precharges the first bit line to the first voltage when the first source line and the second source line are precharged.

3. The device of claim 2, wherein when the control circuit precharges the first bit line to the first voltage, the control circuit changes, to an ON state, an equalizer switch configured to short-circuit the first bit line and the first source line, the equalizer switch being arranged between the first bit line and the first source line.

4. The device of claim 3, wherein the equalizer switch is a transistor configured such that one end of a current path is electrically connected to the first bit line, and the other end is electrically connected to the first source line.

5. The device of claim 1, wherein the control circuit precharges a second bit line electrically connected to the unselected memory string to the first voltage when the first source line and the second source line are precharged.

6. The device of claim 1, wherein each of the memory strings includes:
   word lines stacked on the semiconductor substrate;
   a semiconductor layer including a pair of pillar-shaped portions extending in a stacking direction of the word lines and a connection portion connecting the pair of pillar-shaped portions at lower ends; and
   memory cells formed at crossing portions between the word lines and the semiconductor layer, the memory cells being arranged such that a current path is in series along the semiconductor layer, the one end of the current path is connected to a source line, and the other end is connected to a bit line.

7. A nonvolatile semiconductor memory device comprising:
   a semiconductor substrate;
   a memory cell array including a plurality of memory strings formed above the semiconductor substrate, each memory string including a plurality of memory cells, a part of memory cells being configured to stacked above the semiconductor substrate;
   a sense amplifier for reading data of the memory cell array; and
   a control circuit configured to control a plurality of voltages applied to the memory cell array and the sense amplifier,
   wherein the sense amplifier includes:
   a first current path including a first transistor configured such that one end of the current path is electrically connected to a first bit line and a second transistor configured such that one end of the current path is electrically connected to the other end of the first transistor and the other end is electrically connected to a first source line and a second source line; and
   a second current path including a third transistor configured such that one end of the current path is electrically connected to the first bit line and the other end is electrically connected to the first source line and the second source line,
   in a read operation, if the first bit line and the first source line are electrically connected to a read-target memory cell and the second source line is electrically connected to an unselected memory string, the control circuit precharges the second source line to a second voltage higher than a first voltage when the first source line is precharged to the first voltage, the control circuit precharges the first bit line to the first voltage when the first source line and the second source line are precharged, when the first bit line is precharged to the first voltage, the control circuit changes the first transistor, the second transistor, and the third transistor to an ON state, thereby short-circuiting the first bit line and a potential of the first source line, and a voltage applied to a gate of the first transistor is higher than a voltage applied to a gate of the second transistor.

8. The device of claim 7, wherein the first current path further includes a fourth transistor located between the second transistor and the first source line and the second source line, and configured such that one end of the current path is electrically connected to the other end of the second transistor and the other end is electrically connected to the first source line and the second source line, and the second current path further includes a fifth transistor located between the third transistor and the first source line and the second source line, and configured such that one end of the current path is electrically connected to the other end of the third transistor and the other end is electrically connected to the first source line and the second source line, a size of the fifth transistor being smaller than a size of the fourth transistor.

9. The device of claim 7, wherein the control circuit precharges the first bit line to the first voltage, and thereafter, precharges the first bit line to the second voltage.

10. The device of claim 9, wherein the control circuit changes the first transistor to an OFF state after the control circuit changes the first transistor to an ON state but before the control circuit precharges the first bit line to the second voltage.

11. The device of claim 7, wherein each of the memory strings includes:
word lines stacked on the semiconductor substrate;
a semiconductor layer including a pair of pillar-shaped portions extending in a stacking direction of the word lines and a connection portion connecting the pair of pillar-shaped portions at lower ends; and
memory cells formed at crossing portions between the word lines and the semiconductor layer, the memory cells being arranged such that a current path is in series along the semiconductor layer, the one end of the current path is connected to a source line, and the other end is connected to a bit line.

12. A nonvolatile semiconductor memory device comprising:
a semiconductor substrate;
a memory cell array including memory strings formed above the semiconductor substrate, each memory string including a plurality of memory cells, a part of memory cells being configured to stacked above the semiconductor substrate;
a sense amplifier for reading data of the memory cell array; and
a control circuit configured to control a plurality of voltages applied to the memory cell array and the sense amplifier,
wherein the sense amplifier includes:
a first current path including a first transistor configured such that one end of the current path is electrically connected to a first bit line and the other end is electrically connected to a first source line and a second source line; and
a second current path including a second transistor configured such that one end of the current path is electrically connected to the first bit line and the other end is electrically connected to the first source line and the second source line, in a read operation, if the first bit line and the first source line are electrically connected to a read-target memory cell and the second source line is electrically connected to an unselected memory string, the control circuit precharges the second source line to a second voltage higher than a first voltage when the first source line is precharged to the first voltage, the control circuit precharges the first bit line to the first voltage when the first source line and the second source line are precharged, when the first bit line is precharged to the first voltage, the control circuit changes the first transistor and the second transistor to an ON state, thereby short-circuiting the first bit line and a potential of the first source line, and a voltage applied to a gate of the first transistor is higher than a summation voltage of the first voltage and a threshold value voltage of the first transistor.

13. The device of claim 12, wherein the first current path further includes a third transistor located between the first transistor and the first source line and the second source line, and configured such that one end of the current path is electrically connected to the other end of the first transistor and the other end is electrically connected to the first source line and the second source line, and the second current path further includes a fourth transistor located between the second transistor and the first source line and the second source line, and configured such that one end of the current path is electrically connected to the other end of the second transistor and the other end is electrically connected to the first source line and the second source line, a size of the fourth transistor being smaller than a size of the third transistor.

14. The device of claim 12, wherein a voltage applied to a gate of the first transistor is twice or higher than the summation voltage of the first voltage and the threshold value voltage of the first transistor.

15. The device of claim 12, wherein after the first bit line is precharged to the first voltage, the first bit line is precharged to the second voltage.

16. The device of claim 12, wherein the control circuit changes the first transistor to an OFF state after the control circuit changes the first transistor to the ON state but before the control circuit precharges the first bit line to the second voltage.

17. The device of claim 12, wherein each of the memory strings includes:
word lines stacked on the semiconductor substrate;
a semiconductor layer including a pair of pillar-shaped portions extending in a stacking direction of the word lines and a connection portion connecting the pair of pillar-shaped portions at lower ends; and
memory cells formed at crossing portions between the word lines and the semiconductor layer, the memory cells being arranged such that a current path is in series along the semiconductor layer, the one end of the current path is connected to a source line, and the other end is connected to a bit line.

* * * * *